United States Patent
Hong

(10) Patent No.: US 11,670,239 B2
(45) Date of Patent: Jun. 6, 2023

(54) GATE DRIVING CIRCUIT AND DISPLAY DEVICE

(71) Applicant: LG DISPLAY CO., LTD., Seoul (KR)

(72) Inventor: Yewon Hong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/536,143

(22) Filed: Nov. 29, 2021

(65) Prior Publication Data

US 2022/0199032 A1 Jun. 23, 2022

(30) Foreign Application Priority Data

Dec. 18, 2020 (KR) .................. 10-2020-0177973

(51) Int. Cl.
G09G 3/3266 (2016.01)
G09G 3/3225 (2016.01)
H01L 27/12 (2006.01)
G09G 3/36 (2006.01)

(52) U.S. Cl.
CPC ......... *G09G 3/3266* (2013.01); *G09G 3/3225* (2013.01); *H01L 27/1251* (2013.01); *G09G 3/3677* (2013.01); *G09G 2300/0819* (2013.01); *G09G 2300/0842* (2013.01); *G09G 2310/08* (2013.01); *G09G 2330/02* (2013.01)

(58) Field of Classification Search
CPC .......... H01L 27/1251; H01L 29/78633; G11C 19/28
See application file for complete search history.

(56) References Cited

U.S. PATENT DOCUMENTS

| | | | | |
|---|---|---|---|---|
| 2018/0130435 A1* | 5/2018 | Lee | ...................... | G09G 3/3677 |
| 2018/0374442 A1* | 12/2018 | Hao | ...................... | G09G 3/3677 |
| 2019/0147824 A1* | 5/2019 | Lee | ...................... | G11C 19/287 345/55 |
| 2021/0142713 A1* | 5/2021 | Feng | ................... | G09G 3/3674 |

* cited by examiner

*Primary Examiner* — Nitin Patel
*Assistant Examiner* — Amen W Bogale
(74) *Attorney, Agent, or Firm* — Polsinelli PC

(57) ABSTRACT

A gate driving circuit includes a first type of stage circuit for outputting a first gate signal and a second type of stage circuit for outputting a second gate signal, and further including a bias transistor for supplying, when turned-on, a bias voltage to a shield metal positioned to overlap with a semiconductor layer of a specific transistor among a plurality of transistors included in the first type of stage circuit, thereby preventing a leakage current from occurring inside the gate driving circuit.

19 Claims, 17 Drawing Sheets

GATE DRIVING CIRCUIT AND DISPLAY DEVICE

CROSS-REFERENCE TO RELATED APPLICATION

This application claims the priority of Korean Patent Application No. 10-2020-0177973, filed on Dec. 18, 2020, which is hereby incorporated by reference in its entirety for all purposes as if fully set forth herein.

BACKGROUND

Field of the Disclosure

The present disclosure relates to a gate driving circuit and a display device.

Description of the Background

The growth of the information society leads to increased demand for various types of display devices, and in recent years, various display devices such as a liquid crystal display device and an organic light emitting display device are utilized.

A display device may include a display panel in which a plurality of data lines and a plurality of gate lines are disposed, a data driving circuit for driving the plurality of data lines, a gate driving circuit for driving the plurality of gate lines, and the like.

Meanwhile, the gate driving circuit includes a plurality of transistors, and there has been a phenomenon in which an unwanted leakage current occurs in at least one of the plurality of transistors. Such leakage current in the gate driving circuit may cause a malfunction of the gate driving circuit.

SUMMARY

Accordingly, the present disclosure is to provide a gate driving circuit and a display device capable of preventing leakage current from occurring inside the gate driving circuit.

The present disclosure is also to provide a gate driving circuit and a display device configured to have a differential structure including different types of stage circuits.

The present disclosure is also to provide a gate driving circuit and a display device capable of preventing leakage current by using a differential structure between the odd-numbered stage circuit and the even-numbered stage circuit.

Further, the present disclosure is to provide a gate driving circuit and a display device capable of also preventing a gate output deviation while preventing leakage current by using a differential structure between the odd-numbered stage circuit and the even-numbered stage circuit.

In one aspect, the present disclosure provides a gate driving circuit including a first type of stage circuit including a first carry output circuit receiving a first clock signal and a first low-level voltage (−12 V) and outputting a first carry signal to a first carry output node and a first gate output circuit receiving the first clock signal and the first low-level voltage and outputting a first gate signal to a first gate output node, and a second type of stage circuit including a second carry output circuit receiving a carry clock signal and a second low-level voltage (−16 V) and outputting a second carry signal to a second carry output node and a second gate output circuit receiving a second clock signal and the first low-level voltage (−12 V) and outputting a second gate signal to a second gate output node.

The gate driving circuit according to aspects of the present disclosure may include a bias transistor for supplying, when turned on, a bias voltage to a shield metal positioned to overlap a semiconductor layer of a specific transistor among a plurality of transistors included in the first type of stage circuit.

The first carry output circuit may include a first carry pull-up transistor to which the first clock signal is input and a first carry pull-down transistor to which the first low-level voltage is input, and may output the first carry signal to the first carry output node to which the first carry pull-up transistor and the first carry pull-down transistor are connected.

The first gate output circuit may include a first gate pull-up transistor to which the first clock signal is input and a first gate pull-down transistor to which the first low-level voltage is input, and may output the first gate signal to the first gate output node to which the first gate pull-up transistor and the first gate pull-down transistor are connected.

The second carry output circuit may include a second carry pull-up transistor to which the carry clock signal is input and a second carry pull-down transistor to which the second low-level voltage is input, and may output the second carry signal to the second carry output node to which the second carry pull-up transistor and the second carry pull-down transistor are connected.

The second gate output circuit may include a second gate pull-up transistor to which the second clock signal is input and a second gate pull-down transistor to which the first low-level voltage is input, and may output the second gate signal to the second gate output node to which the second gate pull-up transistor and the second gate pull-down transistor are connected.

The bias transistor may supply, when turned on, the bias voltage to a shield metal positioned to overlap a semiconductor layer of the first gate pull-up transistor as the specific transistor included in the first type of stage circuit.

The bias transistor may supply, when turned on, the bias voltage to a shield metal positioned to overlap a semiconductor layer of the first carry pull-up transistor as the specific transistor included in the first type of stage circuit.

The first type of stage circuit may further include a first Q node charging transistor for charging a gate node of the first gate pull-up transistor, a first Q node discharging transistor for discharging a gate node of the first gate pull-up transistor, a first QB node charging transistor for charging a gate node of the first gate pull-down transistor, and a first QB node discharging transistor for discharging a gate node of the first gate pull-down transistor.

The second type of stage circuit may further include a second Q node charging transistor for charging a gate node of the second gate pull-up transistor, a second Q node discharging transistor for discharging a gate node of the second gate pull-up transistor, a second QB node charging transistor for charging a gate node of the second gate pull-down transistor, and a second QB node discharging transistor for discharging a gate node of the second gate pull-down transistor.

The bias transistor may supply, when turned on, the bias voltage to a shield metal positioned to overlap a semiconductor layer of the first QB node discharging transistor as the specific transistor included in the first type of stage circuit.

A gate node of the bias transistor may be electrically connected to a gate node of the second Q node charging transistor in the second type of stage circuit.

The first type of stage circuit may further include a first Q node charging transistor for charging a gate node of the first gate pull-up transistor and a first Q node discharging transistor for discharging a gate node of the first gate pull-up transistor The second type of stage circuit may further include a second Q node charging transistor for charging a gate node of the second gate pull-up transistor and a second Q node discharging transistor for discharging a gate node of the second gate pull-up transistor.

A third clock signal may be input to a gate node of the first gate pull-down transistor. A fourth clock signal may be input to a gate node of the second gate pull-down transistor.

A low-level voltage applied to a gate node of the first gate pull-up transistor may be higher than the bias voltage, and a low-level voltage applied to a gate node of the second gate pull-up transistor may be equal to the bias voltage.

A first start signal input to the first type of stage circuit and a second start signal input to the second type of stage circuit may have different amplitudes from each other.

The bias transistor may be controlled to be turned on/off based on a second start signal input to the second type of stage circuit or another carry signal serving as the second start signal. The second start signal may be a carry signal of another stage circuit.

The gate driving circuit may further include a bias capacitor connected between the shield metal and the first gate output node.

The bias voltage may be a voltage which is lower than the first low-level voltage and equal to the second low-level voltage.

The gate driving circuit may be disposed in a non-display area, and the specific transistor may be a coplanar type.

When the bias voltage is applied to the shield metal, a voltage difference between a source node and a gate node of the specific transistor may be less than zero.

After the bias voltage is applied to the shield metal, a voltage of the shield metal increases in synchronization with a voltage change of the first gate output node, and the voltage of the shield metal increased in synchronization with the voltage change of the first gate output node may be lower than a high-level voltage of the first gate output node.

In another aspect, aspects of the present disclosure may provide a display device including a substrate, a first gate line and a second gate line disposed on the substrate, and a gate driving circuit for outputting a first gate signal to the first gate line and outputting a second gate signal to the second gate line.

The gate driving circuit may include a first type of stage circuit including a first carry output circuit receiving a first clock signal and a first low-level voltage (−12 V) and outputting a first carry signal to a first carry output node and a first gate output circuit receiving the first clock signal and the first low-level voltage and outputting the first gate signal to the first gate line through a first gate output node, and a second type of stage circuit including a second carry output circuit receiving a carry clock signal and a second low-level voltage (−16 V) and outputting a second carry signal to a second carry output node and a second gate output circuit receiving a second clock signal and the first low-level voltage (−12 V) and outputting the second gate signal to the second gate line through a second gate output node.

The gate driving circuit may further include a bias transistor for supplying, when turned on, a bias voltage to a shield metal positioned to overlap a semiconductor layer of a specific transistor among a plurality of transistors included in the first type of stage circuit.

Among the first gate line and the second gate line, one may be an odd-numbered gate line and another may be an even-numbered gate line.

The substrate may include a display area and a non-display area outside the display area, and the non-display area may include a first non-display area positioned on one side of the display area and a second non-display area positioned on another side of the display area.

A method of supplying the gate signal may be a single feeding method or a double feeding method.

Among the first type of stage circuit and the second type of stage circuit, one may be connected to or disposed in the first non-display area, and another may be connected or disposed in the second non-display area.

The first type of stage circuit and the second type of stage circuit may be connected to or disposed in the first non-display area, and another stage circuit of the first type and another stage circuit of the second type may be connected or disposed in the second non-display area.

In another aspect, aspects of the present disclosure may provide a display device comprising above gate driving circuit.

According to aspects of the present disclosure, it is possible to provide a gate driving circuit and a display device capable of preventing leakage current from occurring inside the gate driving circuit.

According to aspects of the present disclosure, it is possible to provide a gate driving circuit and a display device configured to have a differential structure including different types of stage circuits.

According to aspects of the present disclosure, it is possible to provide a gate driving circuit and a display device capable of preventing leakage current by using a differential structure between the odd-numbered stage circuit and the even-numbered stage circuit.

According to aspects of the present disclosure, it is possible to provide a gate driving circuit and a display device capable of also preventing a gate output deviation while preventing leakage current by using a differential structure between the odd-numbered stage circuit and the even-numbered stage circuit.

DETAILED DESCRIPTION

Figure 1:
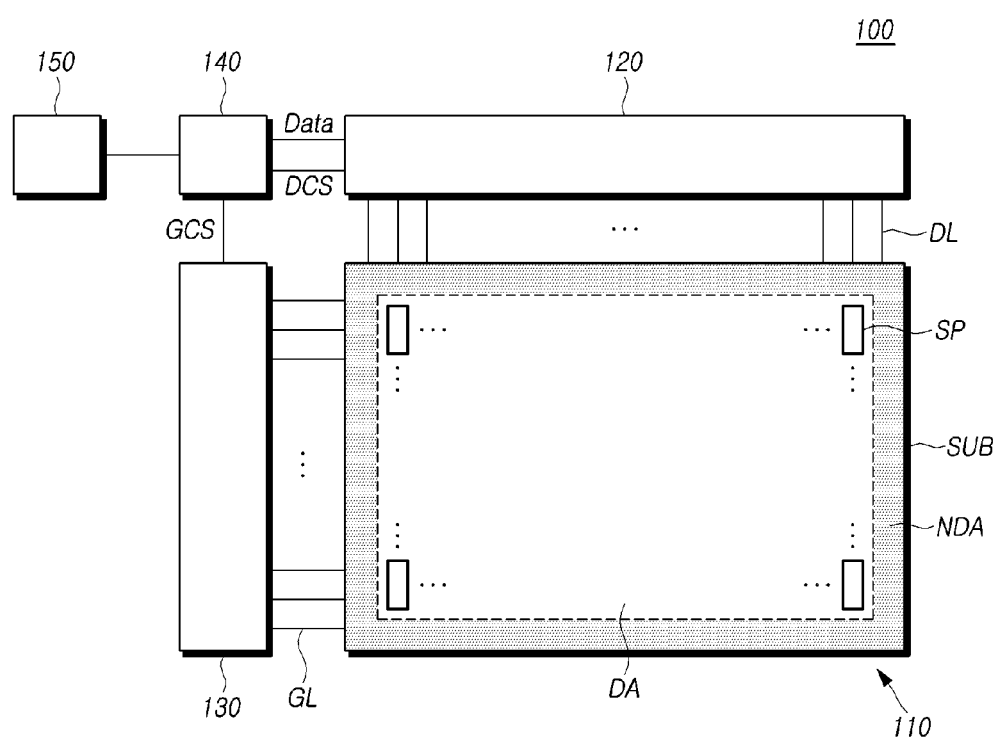
FIG. 1 illustrates a system configuration of a display device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 illustrates a system configuration included in a display device 100 according to aspects of the present disclosure.

Referring to FIG. 1, the display device 100 may include a display panel 110 and a driving circuit for driving the display panel 110.

The driving circuit may include a data driving circuit 120 and a gate driving circuit 130, and may further include a controller 140 for controlling the data driving circuit 120 and the gate driving circuit 130.

The display panel 110 may include a substrate SUB and signal lines such as a plurality of data lines DL and a plurality of gate lines GL disposed on the substrate SUB. The display panel 110 may include a plurality of subpixels SP connected to a plurality of data lines DL and a plurality of gate lines GL.

The display panel 110 may include a display area DA in which an image is displayed and a non-display area NDA in which an image is not displayed. In the display panel 110, a plurality of subpixels SP for displaying an image may be disposed in the display area DA. In the non-display area NDA, the driving circuits 120, 130 and 140 may be electrically connected or mounted, and a pad unit to which an integrated circuit or a printed circuit is connected may be disposed.

The data driving circuit 120 is a circuit for driving the plurality of data lines DL, and may output data voltages to the plurality of data lines DL. The gate driving circuit 130 is a circuit for driving the plurality of gate lines GL, and may supply gate signals to the plurality of gate lines GL. The controller 140 may supply the data driving timing control signal DCS to the data driving circuit 120 to control the operation timing of the data driving circuit 120. The controller 140 may supply the gate driving timing control signal GCS for controlling the operation timing of the gate driving circuit 130 to the gate driving circuit 130.

The controller 140 may start scanning according to the timing implemented in each frame, and may convert the input image data input from the outside according to the data voltage format used by the data driving circuit 120 to supply the converted image data to the data driving circuit 120 and to control the data driving at an appropriate time according to the scan.

The controller 140 may receive, in addition to the input image data, various timing signals including a vertical synchronization signal VSYNC, a horizontal synchronization signal HSYNC, an input data enable signal DE, a clock signal CLK from the outside (e.g., host system 150).

The controller 140 may generate various control signals DCS and GCS by using various timing signals such as the vertical synchronization signal VSYNC, the horizontal synchronization signal HSYNC, the input data enable signal DE and the clock signal CLK received from the outside, and may output the control signals to the data driving circuit 120 and the gate driving circuit 130.

For example, in order to control the gate driving circuit 130, the controller 140 may output various gate control signals GCS including a gate start pulse GSP, a gate shift clock GSC, and a gate output enable signal GOE.

In addition, in order to control the data driving circuit 120, the controller 140 may output various data control signals DCS including a source start pulse SSP, a source sampling clock SSC, a source output enable signal SOE, or the like.

The controller 140 may be implemented as a separate component from the data driving circuit 120, or may be integrated with the data driving circuit 120 and implemented as an integrated circuit.

The data driving circuit 120 may drive the plurality of data lines DL by receiving image data from the controller 140 and supplying data voltages to the plurality of data lines DL. Here, the data driving circuit 120 may be also referred to as a source driving circuit.

The data driving circuit 120 may include one or more source driver integrated circuits SDIC.

Each source driver integrated circuit SDIC may include a shift register, a latch circuit, a digital-to-analog converter, an output buffer, and the like. Each source driver integrated circuit SDIC may further include an analog-to-digital converter ADC, in some cases.

For example, each source driver integrated circuit SDIC may be connected to the display panel 110 by a tape automated bonding (TAB) method, or may be connected to a bonding pad of the display panel 110 in a method of a chip-on-glass (COG) or a chip-on-panel (COP), or may be implemented in a chip-on-film (COF) method to be connected to the display panel 110.

The gate driving circuit 130 may output a gate signal of a turn-on level voltage or a gate signal of a turn-off level voltage according to the control of the controller 140. The gate driving circuit 130 may sequentially drive the plurality of gate lines GL by sequentially supplying a gate signal having a turn-on level voltage to the plurality of gate lines GL.

The gate driving circuit 130 may be connected to the display panel 110 by a tape automated bonding (TAB) method, or may be connected to a bonding pad of the display panel 110 by a chip-on-glass (COG) or chip-on-panel (COP) method, or may be connected to the display panel 110 according to a chip-on-film (COF) method. Alternatively, the gate driving circuit 130 may be formed in the non-display area NDA of the display panel 110 in a gate-in-panel (GIP) type. The gate driving circuit 130 may be disposed on or connected to the substrate SUB. That is, in the case of the GIP type, the gate driving circuit 130 may be disposed in the non-display area NDA of the substrate SUB. The gate driving circuit 130 may be connected to the substrate SUB in the case of a chip-on-glass (COG) type, a chip-on-film (COF) type, or the like.

When a specific gate line GL is opened by the gate driving circuit 130, the data driving circuit 120 may convert the image data received from the controller 140 into an analog data voltage and supply the analog data voltage to the data line DL.

The data driving circuit 120 may be connected to one side (e.g., upper or lower side) of the display panel 110. Depending on the driving method, the panel design method, etc., the data driving circuit 120 may be connected to both sides (e.g., upper and lower sides) of the display panel 110 or may be connected to at least two of the four sides of the display panel 110.

The gate driving circuit 130 may be connected to one side (e.g., left or right) of the display panel 110. Depending on the driving method, the panel design method, etc., the gate driving circuit 130 may be connected to both sides (e.g., left and right) of the display panel 110 or may be connected to at least two of the four sides of the display panel 110.

The controller 140 may be a timing controller used in a general display technology or a control device capable of further performing other control functions including a timing controller. Alternatively, the controller may be a control device different from the timing controller, or may be a circuit within the control device. The controller 140 may be implemented with various circuits or electronic components, such as an integrated circuit (IC), a field programmable gate array (FPGA), an application specific integrated circuit (ASIC), or a processor.

The controller 140 may be mounted on a printed circuit board or a flexible printed circuit, etc., and may be electrically connected to the data driving circuit 120 and the gate driving circuit 130 through the printed circuit board or the flexible printed circuit, etc.

The controller 140 may transmit/receive signals to and from the data driving circuit 120 according to one or more predetermined interfaces. Here, for example, the interface may include a low voltage differential signaling (LVDS) interface, an EPI interface, and a serial peripheral interface (SPI).

The controller 140 may include a storage medium such as one or more registers.

The display device 100 according to the aspects of the present disclosure may be a self-luminous display such as an organic light emitting diode (OLED) display, a quantum dot display, and a micro light emitting diode display, etc.

In the case that the display device 100 according to aspects of the present disclosure is an OLED display, each subpixel SP may include an organic light emitting diode (OLED) for emitting light as a light emitting device. If the display device 100 according to aspects of the present disclosure is a quantum dot display, each subpixel SP may include a light emitting device made of quantum dots which are self-luminous semiconductor crystals. If the display device 100 according to the aspects of the present disclosure is a micro LED display, each subpixel SP may include micro light emitting devices made of self-luminous inorganic material as a light emitting device.

Figure 2A:
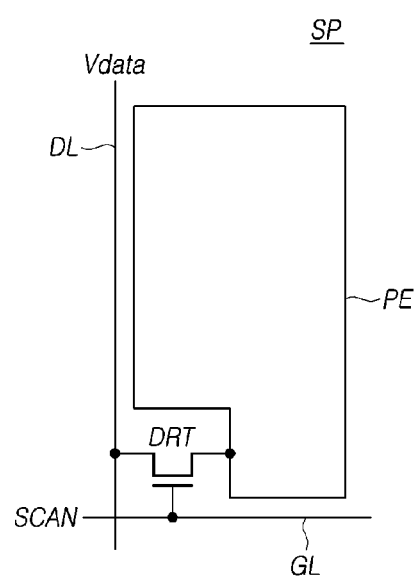
FIGS. 2A and 2B illustrate equivalent circuits of a display device according to example aspects.

FIG. 2A illustrates an equivalent circuit of the display device 100 according to aspects of the present disclosure.

Referring to FIG. 2A, in the case that the display device 100 is implemented as a liquid crystal display device, each subpixel SP may include a driving transistor DRT and a pixel electrode PE.

A source node or a drain node of the driving transistor DRT may be electrically connected to the data line DL, a gate node of the driving transistor DRT may be electrically connected to the gate line GL, and the drain node or the source node of the driving transistor DRT may be electrically connected to the pixel electrode PE.

The driving transistor DRT may be turned on by a scan signal SCAN supplied from the gate line GL electrically connected to the gate node, and transmit the data voltage Vdata supplied from the data line DL to the pixel electrode PE. The data voltage Vdata applied to the pixel electrode PE may form a storage capacitor with the common voltage applied to the common electrode.

Figure 2B:
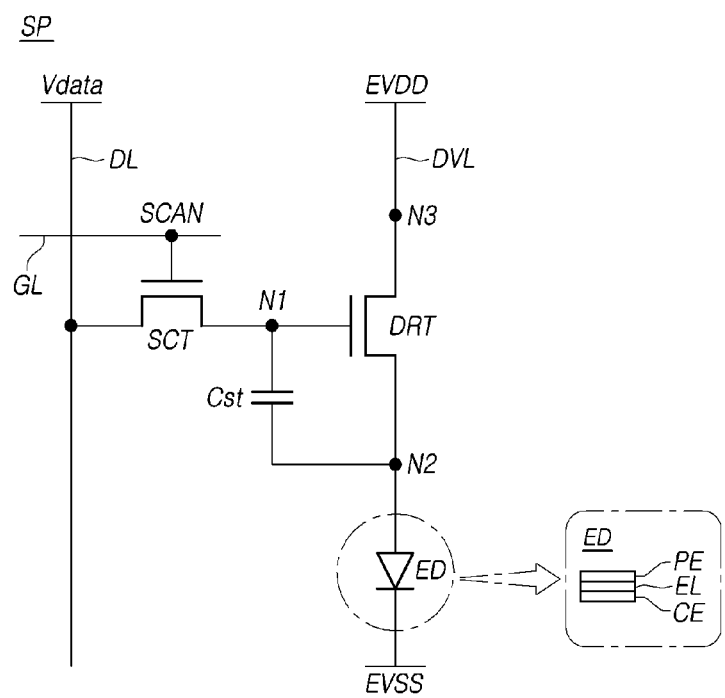

FIG. 2B illustrates an equivalent circuit of the display device 100 according to aspects of the present disclosure.

Referring to FIG. 2B, in the case that the display device 100 according to aspects of the present disclosure is a self-luminous display such as an organic light emitting display device, each of the plurality of subpixels SP disposed on the display panel 110 of the display device 100 may include a light emitting device ED, a driving transistor DRT, a scan transistor SCT, and a storage capacitor Cst.

Referring to FIG. 2B, the light emitting device ED may include a pixel electrode PE and a common electrode CE, and may include a light emitting layer EL positioned between the pixel electrode PE and the common electrode CE.

The pixel electrode PE of the light emitting device ED may be an electrode disposed in each subpixel SP, and the common electrode CE may be an electrode commonly disposed in all sub-pixels SP. Here, the pixel electrode PE may be an anode electrode and the common electrode CE may be a cathode electrode. Conversely, the pixel electrode PE may be a cathode electrode and the common electrode CE may be an anode electrode.

For example, the light emitting device ED may be an organic light emitting diode (OLED), a light emitting diode (LED), or a quantum dot light emitting device.

The driving transistor DRT is a transistor for driving the light emitting device ED, and may include a first node N1, a second node N2, and a third node N3. The light emitting device ED may be electrically connected between the second node N2 and a line supplying a driving voltage EVSS. The driving voltage EVSS may be a low potential driving voltage.

The first node N1 of the driving transistor DRT may be a gate node of the driving transistor DRT, and may be electrically connected to a source node or a drain node of the scan transistor SCT. The second node N2 of the driving transistor DRT may be a source node or a drain node of the driving transistor DRT, and may be electrically connected to a source node or a drain node of the sensing transistor, and may also be electrically connected to the pixel electrode PE of the light emitting device ED. The third node N3 of the driving transistor DRT may be electrically connected to a driving voltage line DVL supplying a driving voltage EVDD.

The scan transistor SCT may be controlled by a scan pulse SCAN, which is a type of gate signal, and may be connected between the first node N1 of the driving transistor DRT and the data line DL. In other words, the scan transistor SCT may be turned on or turned off according to the scan pulse SCAN supplied from a scan line SCL, which is a type of the gate line GL, so as to control the connection between the data line DL and the first node N1 of the driving transistor DRT.

The scan transistor SCT may be turned on by the scan pulse SCAN having a turn-on level voltage, and may transmit the data signal Vdata supplied from the data line DL to the first node N1 of the driving transistor DRT.

Here, if the scan transistor SCT is an n-type transistor, the turn-on level voltage of the scan pulse SCAN may be a high-level voltage. If the scan transistor SCT is a p-type transistor, the turn-on level voltage of the scan pulse SCAN may be a low-level voltage.

The storage capacitor Cst may be connected between the first node N1 and the second node N2 of the driving transistor DRT. The storage capacitor Cst may be charged with an amount of charge corresponding to the voltage difference between both ends, and may serve to maintain the voltage difference between both ends for a predetermined frame time. Accordingly, during a predetermined frame time, the corresponding subpixel SP may emit light.

Figure 3:
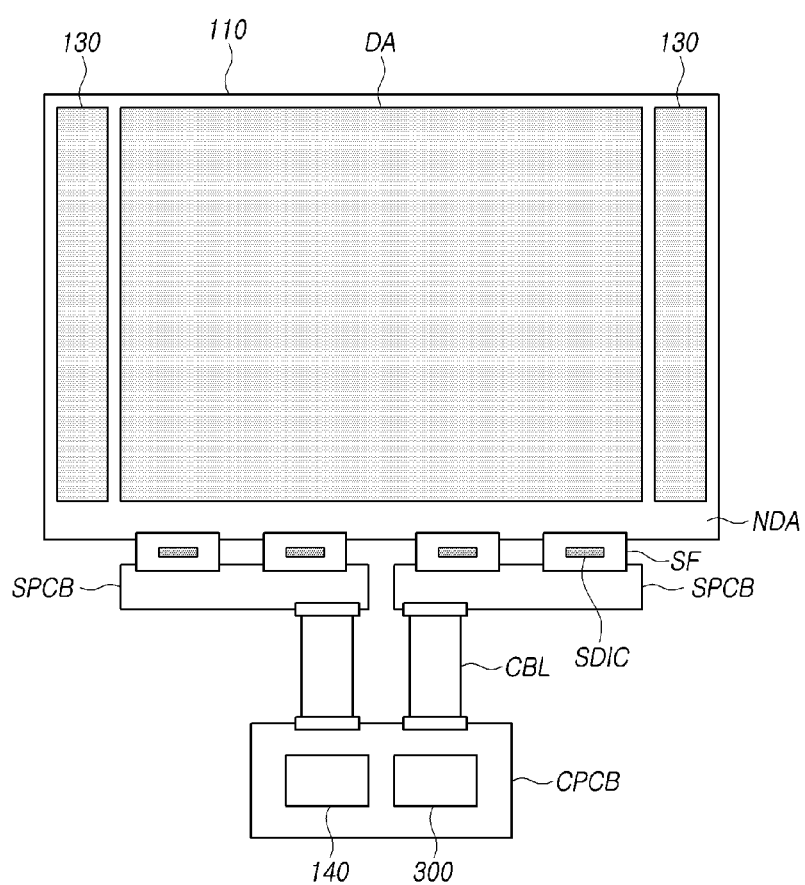
FIG. 3 illustrates an example of a system implementation of a display device according to aspects of the present disclosure.

FIG. 3 illustrates an example of a system implementation of a display device 100 according to aspects of the present disclosure.

Referring to FIG. 3, the display panel 110 may include a display area DA in which an image is displayed and a non-display area NDA in which an image is not displayed.

Referring to FIG. 3, in the case that the data driving circuit 120 includes one or more source driver integrated circuits SDIC and is implemented in a chip-on-film (COF) method, each source driver integrated circuit SDIC may be mounted on the circuit film SF connected to the non-display area NDA of the panel 110.

Referring to FIG. 3, the gate driving circuit 130 may be implemented as a gate-in-panel (GIP) type. In this case, the gate driving circuit 130 may be formed in the non-display area NDA of the display panel 110. Unlike FIG. 3, the gate driving circuit 130 may be implemented as a chip-on-film (COF) type.

In the case that the gate driving circuit 130 is implemented as a gate-in-panel (GIP) type, there may be reduced the size of the bezel of the display panel 110 (i.e., the size of the non-display area NDA).

The display device 100 may include, for circuit connection between one or more source driver integrated circuits SDICs and other devices, at least one source printed circuit board SPCB and a control printed circuit board CPCB for mounting control components and various electrical devices.

The circuit film SF on which the source driver integrated circuit SDIC is mounted may be connected to at least one source printed circuit board SPCB. That is, one side of the circuit film SF mounting the source driver integrated circuit SDIC may be electrically connected to the display panel 110 and another side thereof may be electrically connected to the source printed circuit board SPCB.

The controller 140 and a power management integrated circuit (PMIC) 300 may be mounted on the control printed circuit board CPCB. The controller 140 may perform overall control functions related to driving of the display panel 110, and may control operations of the data driving circuit 120 and the gate driving circuit 130. The power management integrated circuit 300 may supply various voltages or currents to the data driving circuit 120 and the gate driving circuit 130, or may control voltages or currents to be supplied.

At least one source printed circuit board SPCB and the control printed circuit board CPCB may be connected through at least one connection cable CBL. Here, the connection cable CBL may be, for example, a flexible printed circuit (FPC), a flexible flat cable (FFC), or the like.

At least one source printed circuit board SPCB and control printed circuit board CPCB may be implemented by being integrated into one printed circuit board.

The display device 100 according to aspects of the present disclosure may further include a level shifter for adjusting a voltage level. For example, the level shifter may be disposed on the control printed circuit board CPCB or the source printed circuit board SPCB. In the display device 100 according to aspects of the present disclosure, the level shifter may supply signals necessary for gate driving to the gate driving circuit 130. For example, the level shifter may supply a plurality of clock signals to the gate driving circuit 130. Accordingly, the gate driving circuit 130 may output the plurality of gate signals to the plurality of gate lines GL based on the plurality of clock signals input from the level shifter. Here, the plurality of gate lines GL may transmit a plurality of gate signals to the subpixels SP disposed in the display area DA of the substrate SUB.

Figure 4:
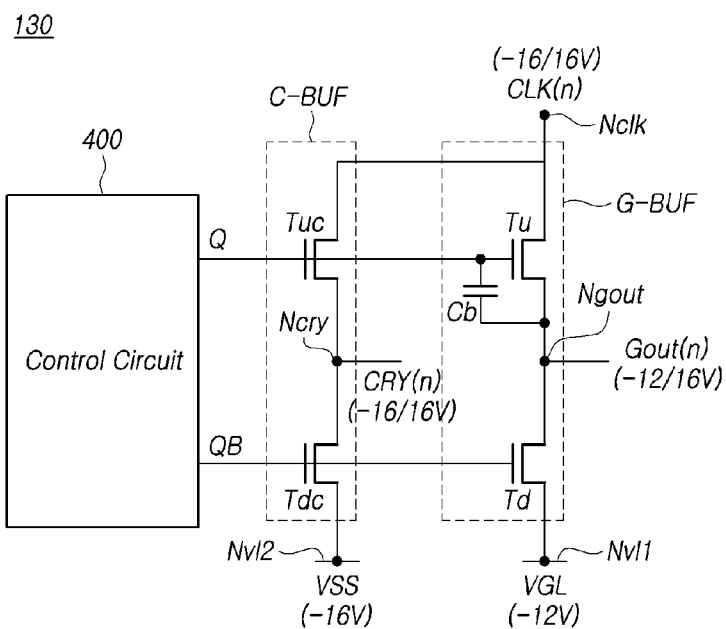
FIG. 4 illustrates a gate driving circuit according to aspects of the present disclosure.

FIG. 4 illustrates a gate driving circuit 130 according to aspects of the present disclosure.

Referring to FIG. 4, the gate driving circuit 130 according to aspects of the present disclosure may include a carry output circuit C-BUF, a gate output circuit G-BUF, and a control circuit 400.

The carry output circuit C-BUF may receive a clock signal CLK(n) and a second low-level voltage VSS and output a carry signal CRY(n) to a carry output node Ncry.

The gate output circuit G-BUF may receive the clock signal CLK(n) and a first low-level voltage VGL and output a gate signal Gout(n) to a gate output node Ngout.

The control circuit 400 may control the carry output circuit C-BUF and the gate output circuit G-BUF.

The carry output circuit C-BUF may include a carry pull-up transistor Tuc to which the clock signal CLK(n) is input and a carry pull-down transistor Tdc to which the second low-level voltage VSS is input, and may output the carry signal CRY(n) to the carry output node Ncry1 to which the carry pull-up transistor Tuc and the carry pull-down transistor Tdc are connected.

In the carry output circuit C-BUF, the carry pull-up transistor Tuc may control a connection between a common clock node Nclk to which the clock signal CLK(n) is input and the carry output node Ncry. The carry pull-down transistor Tdc may control a connection between the second low-level node Nvl2 to which the second low-level voltage VSS is applied and the carry output node Ncry.

The gate output circuit G-BUF may include a gate pull-up transistor Tu to which a clock signal CLK(n) is input and a gate pull-down transistor Td to which a first low-level voltage VGL is input, and may output a gate signal Gout(n) to a gate output node Ngout to which the gate pull-up transistor Tu and the gate pull-down transistor Td are connected.

In the gate output circuit G-BUF, the gate pull-up transistor Tu may control a connection between the common clock node Nclk and the gate output node Ngout, and the gate pull-down transistor Td may control a connection between the first low-level node Nvl1 and the gate output node Ngout.

In the gate pull-up transistor Tu, a capacitor Cb may be electrically connected between a Q node, which is a gate node, and the gate output node Ngout. The capacitor Cb may serve to boost a voltage of the Q node according to the voltage change of the gate output node Ngout.

The control circuit 400 may control a voltage of each gate node of the carry pull-up transistor Tuc and the gate pull-up transistor Tu, and control the voltage of each gate node of the carry pull-down transistor Tdc and the gate pull-down transistor Td.

The gate node of each of the carry pull-up transistor Tuc and the gate pull-up transistor Tu is electrically connected and referred to as a Q node. The gate node of each of the carry pull-down transistor Tdc and the gate pull-down transistor Td is electrically connected and is referred to as a QB node. Here, the QB node may receive a DC voltage or an AC signal through the transistor. The control circuit 400 may include a plurality of transistors to control the voltage of the Q node. Also, the control circuit 400 may further include a plurality of transistors to control the voltage of the QB node.

For example, the control circuit 400 may include one or more transistors for charging the Q node, one or more transistors for discharging the Q node, one or more transistors for charging the QB node, and one or more transistors for discharging the QB node.

Each transistor included in the above-described gate driving circuit 130 may be one of 1) a staggered type in which a gate electrode and a source-drain electrode are positioned with a semiconductor layer interposed therebetween, the source-drain electrode is positioned between the semiconductor layer and a substrate, and has a top-gate electrode structure, 2) an inverted staggered type in which a gate electrode and a source-drain electrode are positioned with a semiconductor layer interposed therebetween, and the gate electrode is positioned between the semiconductor layer and the substrate, and has a bottom-gate electrode structure, 3) a coplanar type in which a gate electrode and a source-drain electrode are located together on one side of a semiconductor layer, and the gate electrode and the source-drain electrode are formed after forming the semiconductor layer, and 4) an inverted coplanar type in which a gate electrode and a source-drain electrode are located together on one side of the semiconductor layer, but the semiconductor layer is formed after forming the gate electrode and the source-drain electrode.

Figure 5:
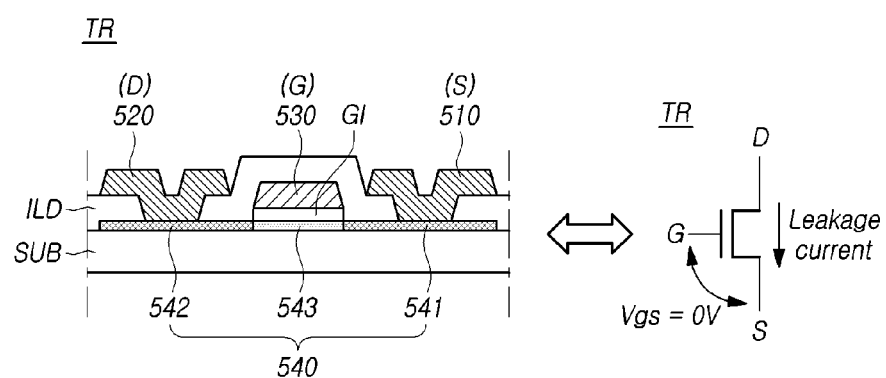
FIG. 5 is a cross-sectional view of a transistor in a gate driving circuit according to aspects of the present disclosure.

FIG. 5 is a cross-sectional view of a specific transistor TR in a gate driving circuit 130 according to aspects of the present disclosure.

Referring to FIG. 5, all or part of the plurality of transistors included in the gate driving circuit 130 may be of a coplanar type. In this case, in the coplanar-type transistor TR, a source electrodes S and 510, a drain electrodes D and 520, and the gate electrodes G and 530 may be all disposed on a semiconductor layer 540 on the substrate SUB. Hereinafter, the source electrode 510, the drain electrode 520 and the gate electrode 530 are also referred to as a source node, a drain node and a gate node, respectively.

The semiconductor layer 540 may include a first conductive portion 541, a second conductive portion 542, and a channel portion 543. The first conductive portion 541 and the second conductive portion 542 may be positioned on both sides with respect to the channel portion 543. The channel portion 543 is a portion which is not conductorized and has semiconductor properties as it is, and the first conductive portion 541 and the second conductive portion 542 are conductorized portions.

A gate insulating film GI is disposed on the semiconductor layer 540, and the gate electrode 530 is disposed on the gate insulating film GI. That is, the gate insulating film GI may be disposed between the channel portion 543 of the semiconductor layer 540 and the gate electrode 530.

An interlayer insulating film ILD may be disposed while covering the gate electrode 530.

The source electrode 510 and the drain electrode 520 may be disposed on the interlayer insulating film ILD.

The source electrode 510 may be in electrical contact with the first conductive portion 541 of the semiconductor layer 540 through a contact hole of the interlayer insulating film ILD.

The drain electrode 520 may be in electrical contact with the second conductive portion 542 of the semiconductor layer 540 through a contact hole of the interlayer insulating film ILD.

The thickness of the gate insulating film GI of the coplanar type transistor is smaller than that of other types. For this reason, the on-current of the coplanar type transistor TR is large. In addition, the coplanar type transistor TR has a characteristic that a drain current can be greatly changed according to a change in the gate voltage.

That is, the coplanar type transistor TR may have a small S-factor. When the drain current flowing through the transistor changes as the gate voltage applied to the gate electrode 530 of the transistor changes, a small S-factor may be the inverse of the change amount of the drain current with respect to the change amount of the gate voltage. The change amount of the drain current with respect to the change amount of the gate voltage corresponds to the slope of the drain current change curve graph according to the change of the gate voltage, and the S-factor is the inverse of the slope. Here, the S-factor is also referred to as a subthreshold swing value SS.

In the case of the coplanar type transistor TR, an initial threshold voltage is often less than zero, so there may be a high possibility of leakage current. That is, since the initial threshold voltage of the coplanar type transistor TR is often less than zero, even if the voltage difference Vgs between the gate electrode 530 and the source electrode 510 becomes zero, the leakage current may occur.

If the leakage current occurs in a situation in which the coplanar type transistor TR in the gate driving circuit 130 is to be turned off, the power consumption may increase.

Among the plurality of transistors in the gate driving circuit 130, the carry pull-up transistor Tuc and the gate pull-up transistor Tu may have a high possibility of generating the leakage current. In addition, among the plurality of transistors in the gate driving circuit 130, a transistor for discharging a QB node may also have a high possibility of generating the leakage current.

Hereinafter, it will be described the gate driving circuit 130 capable of preventing leakage current.

Figure 6:
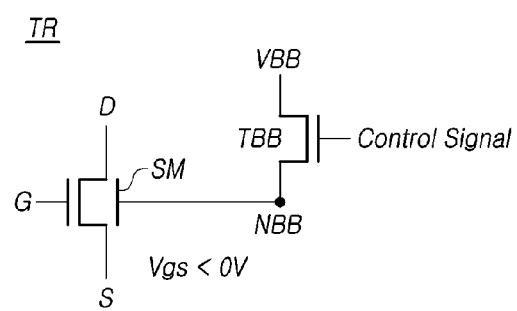
FIGS. 6 and 7 are diagrams for briefly explaining a structure and a method for preventing leakage current in a gate driving circuit according to aspects of the present disclosure.
Figure 7:
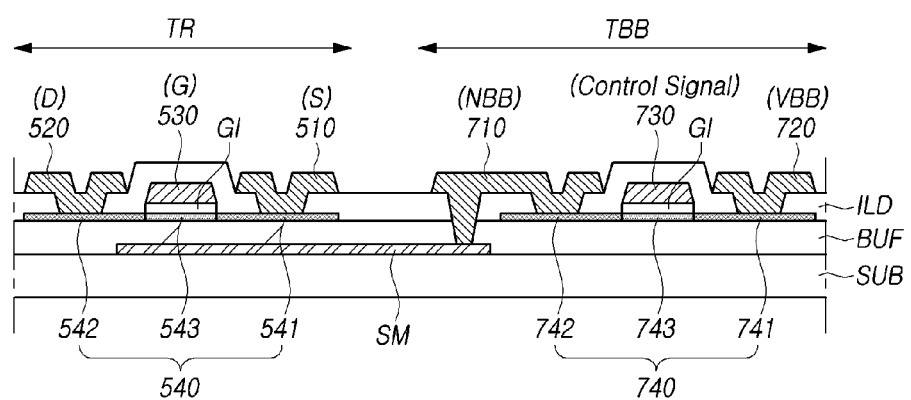
Figure 8:
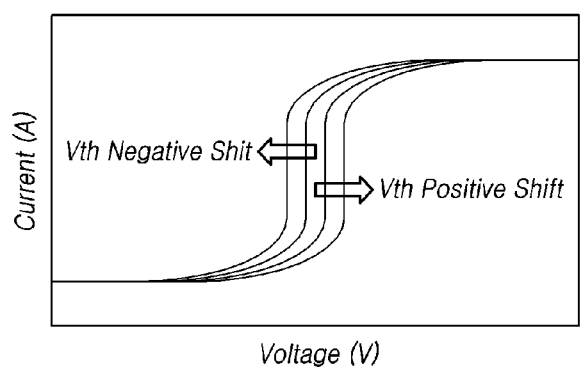
FIG. 8 is a voltage-current characteristic graph of a transistor in a gate driving circuit according to aspects of the present disclosure.

FIGS. 6 and 7 are diagrams for briefly explaining a structure and a method for preventing leakage current in a gate driving circuit 130 according to aspects of the present disclosure. FIG. 8 is a voltage-current characteristic graph of a transistor in a gate driving circuit 130 according to aspects of the present disclosure.

Referring to FIGS. 6 and 7, all of the source electrodes S and 510, the drain electrodes D and 520, and the gate electrodes G and 530 included in the specific transistor TR in the gate driving circuit 130 are positioned on the semiconductor layer 540.

Referring to FIGS. 6 and 7, the gate driving circuit 130 may further include a shield metal SM positioned to overlap the semiconductor layer 540 of the specific transistor TR. Here, the shield metal SM may serve as a light shield metal for preventing the semiconductor layer 540 from being exposed to light.

Referring to FIG. 6, the gate driving circuit 130 may further include a bias transistor TBB for supplying a bias voltage VBB to the shield metal SM when turned on.

Referring to FIG. 7, in the case that the bias transistor TBB is formed of the same coplanar type transistor as the specific transistor TR, the bias transistor TBB may include a first electrode 710, a second electrode 720, and a gate electrode G and 730. The first electrode 710, the second electrode 720, and the gate electrode 730 are positioned on the semiconductor layer 740. The first electrode 710 and the second electrode 720 may be interchanged.

The semiconductor layer 740 may include a first conductive portion 741, a second conductive portion 742, and a channel portion 743. The first conductive portion 741 and the second conductive portion 742 may be positioned on both sides with respect to the channel portion 743. The channel portion 743 is a portion which is not conductorized and has semiconductor properties as it is, and the first conductive portion 741 and the second conductive portion 742 are conductorized portions.

A gate insulating film GI is disposed on the semiconductor layer 740, and the gate electrode 730 is disposed on the gate insulating film GI. That is, the gate insulating film GI may be disposed between the channel portion 743 of the semiconductor layer 740 and the gate electrode 730.

An interlayer insulating film ILD may be disposed while covering the gate electrode 730. The first electrode 710 and the second electrode 720 may be disposed on the interlayer insulating film ILD. The first electrode 710 may be in electrical contact with the second conductive portion 742 of the semiconductor layer 740 through a contact hole of the interlayer insulating film ILD. The second electrode 720 may be in electrical contact with the first conductive portion 741 of the semiconductor layer 740 through a contact hole of the interlayer insulating film ILD.

Referring to FIG. 7, the bias transistor TBB may be on-off controlled by receiving a control signal at the gate electrode 730.

The first electrode 710 of the bias transistor TBB is electrically connected to the shield metal SM, and has the same electrical state as the shield metal SM. The first electrode 710 of the bias transistor TBB is also referred to as a bias node NBB. Also, the shield metal SM electrically connected to the first electrode 710 of the bias transistor TBB is also referred to as a bias node NBB.

Referring to FIGS. 6 and 7, when the bias transistor TBB is turned on, the bias voltage VBB may be applied to the shield metal SM positioned under the semiconductor layer 540 of the specific transistor TR through the turned-on bias transistor TBB. The shield metal SM may be positioned on the substrate SUB, and the buffer layer BUF may be disposed while covering the shield metal SM. Semiconducting layers 540 and 740 may be positioned on the buffer layer BUF. The first electrode 710 of the bias transistor TBB may be electrically connected to the shield metal SM through the through hole of the interlayer insulating layer ILD and the buffer layer BUF.

The shield metal SM may correspond to a back gate electrode of a specific transistor TR in the gate driving circuit 130. In this sense, the bias voltage VBB may be referred to as a back gate voltage. In addition, the specific transistor TR may have a double gate electrode structure including the gate electrode 530 positioned over the semiconductor layer 540 and the shield metal SM serving as a back gate electrode positioned under the semiconductor layer 540.

Referring to FIGS. 6 and 7, when the bias voltage VBB is applied to the shield metal SM positioned under the semiconductor layer 540 of the specific transistor TR through the turned-on bias transistor TBB, a voltage difference Vgs between the source electrode 510 and the gate electrode 530 of the specific transistor TR may be less than zero (Vgs<0).

To achieve this situation, the gate driving circuit 130 may use the lowest voltage among the low-level voltages VGL and VSS used in the gate driving circuit 130 as the bias voltage VBB.

As described above, the bias voltage VBB is set to a low-level voltage such that the Vgs of the specific transistor TR is less than zero. In addition, the bias voltage VBB is set to a voltage lower than the source voltage Vs of the specific transistor TR.

As described above, when the bias voltage VBB is supplied to the shield metal SM, Vgs of the specific transistor TR becomes less than zero, so that there may prevent the leakage current in a situation in which the specific transistor TR is required to be turned off.

Meanwhile, referring to FIG. 8, in the case that the voltage difference Vgs between the gate electrode 530 and the source electrode 510 of the specific transistor TR is zero, if a threshold voltage Vth of the specific transistor TR is shifted in the negative direction (which is referred as 'Vth Negative Shift'), the leakage current may be generated in the specific transistor TR.

However, as shown in FIGS. 6 and 7, through the bias transistor TBB, a sufficiently low bias voltage VBB is supplied to the shield metal SM as the back gate electrode located under the semiconductor layer 540 of the specific transistor TR, so that the voltage difference Vgs between the source electrode 510 and the gate electrode 530 of the specific transistor TR may be less than zero (Vgs<0).

Therefore, even if a phenomenon occurs in which the threshold voltage of the specific transistor TR is negatively shifted in a direction smaller than zero, the Vgs of the specific transistor TR is sufficiently decreased by the bias voltage VBB applied to the shield metal SM, so that there may be prevented the occurrence of an unwanted leakage current in the specific transistor TR.

Figure 9:
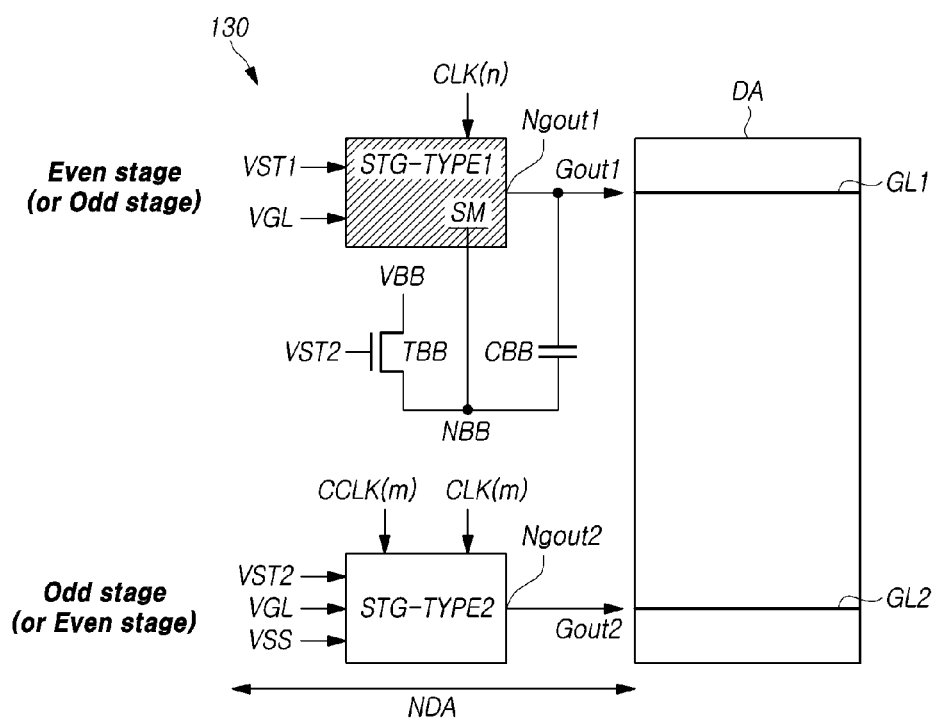
FIG. 9 schematically illustrates a gate driving circuit having a differential structure according to aspects of the present disclosure.
Figure 10:
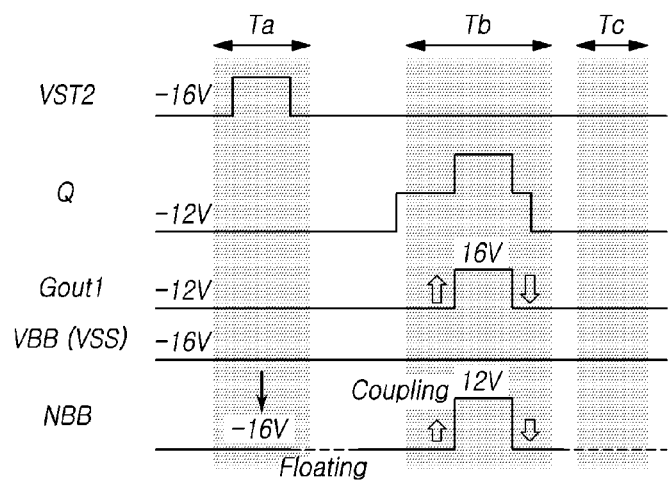
FIG. 10 is a driving timing diagram of a gate driving circuit having a differential structure according to aspects of the present disclosure.

FIG. 9 schematically illustrates a gate driving circuit 130 having a differential structure according to aspects of the present disclosure. FIG. 10 is a driving timing diagram of a gate driving circuit 130 having a differential structure according to aspects of the present disclosure.

Referring to FIG. 9, the gate driving circuit 130 may include a first type of stage circuit STG-TYPE1 and a second type of stage circuit STG-TYPE2, and may further include a bias transistor TBB supplying, when turned on, a bias voltage VBB to a shield metal SM positioned to overlap a semiconductor layer of a specific transistor TR among a plurality of transistors included in the first type of stage circuit STG-TYPE1.

The first type of stage circuit STG-TYPE1 is a circuit that receives a first start signal VST1 and outputs a first gate signal Gout1 to a first gate output node Ngout1 by using one low-level voltage VGL and one clock signal CLK(n). Here, the first start signal VST1 may be a carry signal output from another stage circuit.

The second type of stage circuit STG-TYPE2 is a circuit that receives a second start signal VST2 and outputs a second gate signal Gout2 to a second gate output node Ngout2 by using two separate clock signals CLK(m) and CCLK(m) and two low-level voltages VGL and VSS. Here, the second start signal VST2 may be a carry signal output from another stage circuit.

The first type of stage circuit STG-TYPE1 may be an odd-numbered stage circuit, and the second type of stage circuit STG-TYPE2 may be an even-numbered stage circuit. Alternatively, the first type of stage circuit STG-TYPE1 may be an even-numbered stage circuit, and the second type of stage circuit STG-TYPE2 may be an odd-numbered stage circuit. Thus, for example, m may be (n+1) or (n−1).

Accordingly, among a first gate line GL1 electrically connected to the first gate output node Ngout1 and a second gate line GL2 electrically connected to the second gate output node Ngout2, one may be an odd-numbered gate line and another one may be an even-numbered gate line. That is, the first gate line GL1 may be an odd-numbered gate line and the second gate line GL2 may be an even-numbered gate line. Conversely, the first gate line GL1 may be an even-numbered gate line, and the second gate line GL2 may be an odd-numbered gate line.

The bias transistor TBB may supply, when turned on, the bias voltage VBB to the shield metal SM positioned to overlap the semiconductor layer 540 of a specific transistor TR among a plurality of transistors included in the first type of stage circuit STG-TYPE1.

An electrode 710 electrically connected to the shield metal SM among a source electrode and a drain electrode of the bias transistor TBB is a bias node NBB. The bias node NBB may be the shield metal SM.

When the bias voltage VBB is supplied to the shield metal SM, a voltage difference Vgs between the source node and the gate node of a specific transistor TR among a plurality of transistors included in the first type of stage circuit STG-TYPE1 may be less than zero.

A control signal applied to a gate electrode 730 of the bias transistor TBB may be the second start signal VST2 applied to the second type of stage circuit STG-TYPE2.

The gate driving circuit 130 may further include a bias capacitor CBB connected between the shield metal SM serving as the bias node NBB and the first gate output node Ngout1.

Referring to FIG. 10, the driving period of the bias transistor TBB may include an initialization period Ta, a coupling period Tb, and a maintenance period Tc.

Referring to FIG. 10, in the initialization period Ta, the second start signal VST2 is changed from a second low-level voltage (e.g., −16 V) used in the second type of stage circuit STG-TYPE2 to a high-level voltage (e.g., 16 V). Accordingly, the bias transistor TBB is turned on by the second start signal VST2 applied to the gate electrode 730 of the bias transistor TBB. Accordingly, the bias voltage VBB is applied to the bias node NBB through the turned-on bias transistor TBB. The bias node NBB is the same electrical node as the shield metal SM.

The bias voltage VBB may be a second low-level voltage VSS among the two low-level voltages VGL and VSS input to the second type of stage circuit STG-TYPE2. For example, the bias voltage VBB may be −16 V.

During the initialization period Ta, the voltage of a Q node in the first type of stage circuit STG-TYPE1 may correspond to the first low-level voltage VGL in the first type of stage circuit STG-TYPE1. Also, the first gate signal Gout1 output from the first type of stage circuit STG-TYPE1 may have the first low-level voltage VGL in the first type of stage circuit STG-TYPE1. For example, the first low-level voltage VGL in the first type of stage circuit STG-TYPE1 may be −12 V.

Referring to FIG. 10, during the initialization period Ta or after the initialization period Ta, the second start signal VST2 is changed back to the second low-level voltage (e.g., −16 V). Accordingly, the bias transistor TBB is turned off. Accordingly, the bias node NB and the shield metal SM are electrically in a floating state.

Referring to FIG. 10, during the coupling period Tb, the voltage of the Q node in the first type of stage circuit STG-TYPE1 first rises from the first low-level voltage (e.g., −12 V) and secondary rises, and then, first falls and secondary falls to be the first low-level voltage (e.g., −12 V).

Referring to FIG. 10, in the coupling period Tb, until the first falling of the voltage of the Q node after the secondary rising, a high-level voltage (e.g., 16 V) of the first gate signal Gout1 may be output.

Accordingly, the bias node NBB capacitively coupled to the first gate output node Ngout1 and the bias capacitor CBB may have a voltage value (12 V=−16 V+28 V) that rises from the second low-level voltage (e.g., −16 V) by the voltage change amount (28 V increase from −12 V to 16 V) of the first gate output node Ngout1.

That is, when the bias node NBB is in the floating state, the voltage change of the bias node NBB may be synchronized with the voltage change of the first gate output node Ngout1 by the bias capacitor CBB.

Referring to FIG. 10, after the bias voltage VBB is applied to the shield metal SM, the voltage of the shield metal SM may increase in synchronization with the voltage change of the first gate output node Ngout1. Here, the voltage (e.g., 12 V) of the shield metal SM increased in synchronization with the voltage change of the first gate output node Ngout1 may be lower than the high-level voltage (e.g., 16 V) of the first gate output node Ngout1.

Referring to FIG. 10, during the maintenance period Tc, the voltage of the Q node in the first type of stage circuit STG-TYPE1 completely falls to a first low-level voltage (e.g., −12 V), the first gate signal Gout1 having a first low-level voltage (e.g., −12 V) is output from the first type of stage circuit STG-TYPE1.

Accordingly, the bias node NBB capacitively coupled with the first gate output node Ngout1 by the bias capacitor CBB may have a voltage value (−16 V=12 V-28 V) that is lowered by the amount of voltage change (amount of change −28 V that falls from 16 V to −12 V) of the first gate output node Ngout1.

As described above, the odd-numbered stage circuit and the even-numbered stage circuit in the gate driving circuit 130 according to aspects of the present disclosure may have different types (the first type and the second type). Here, the first type of stage circuit STG-TYPE1 outputs the first gate signal Gout1 using one low-level voltage VGL and one clock signal CLK(n). The second type of stage circuit STG-TYPE2 outputs the second gate signal Gout2 by using two separate clock signals CLK(m) and CCLK(m) and two low-level voltages VGL and VSS.

In aspects of the present disclosure, the first type is a type of the stage circuit using one low-level voltage VGL, and the second type is a type of the stage circuit using two clock signals CLK(m) and CCLK(m) separated from each other.

Figure 11:
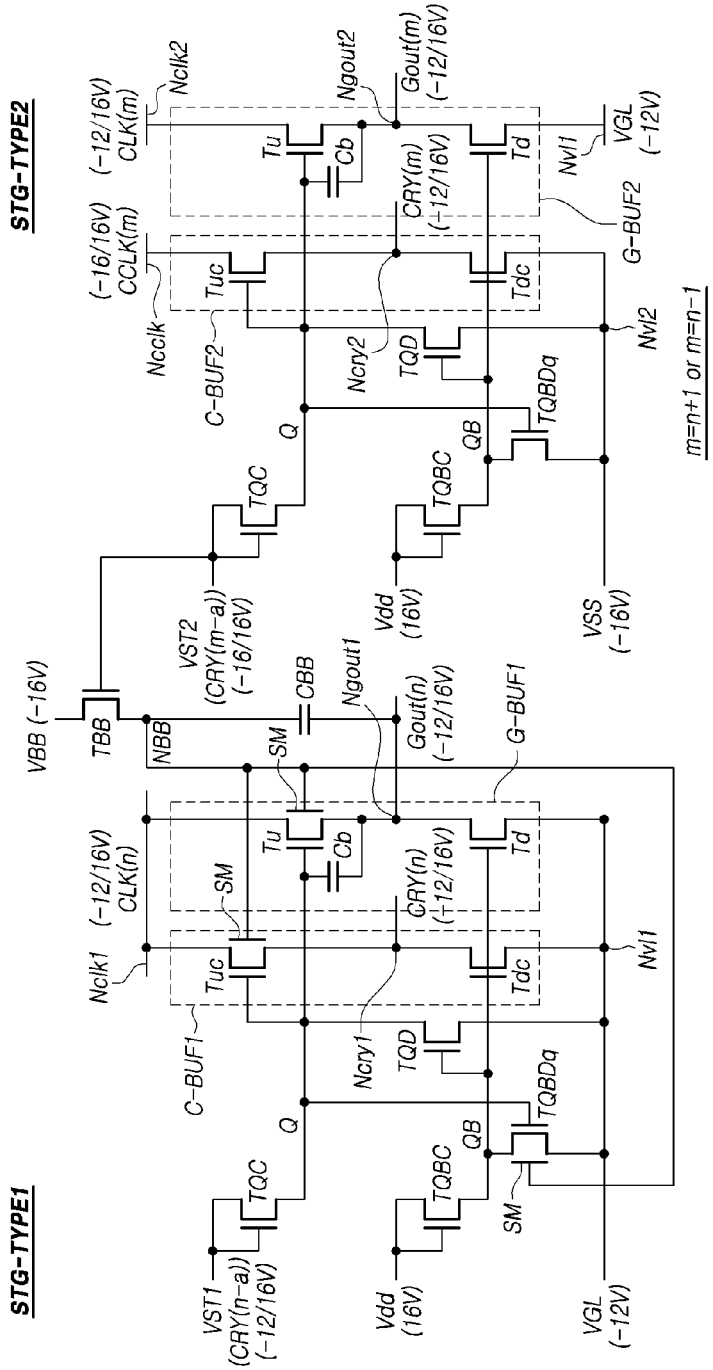
FIG. 11 is an exemplary diagram of a gate driving circuit having a differential structure according to aspects of the present disclosure.
Figure 12:
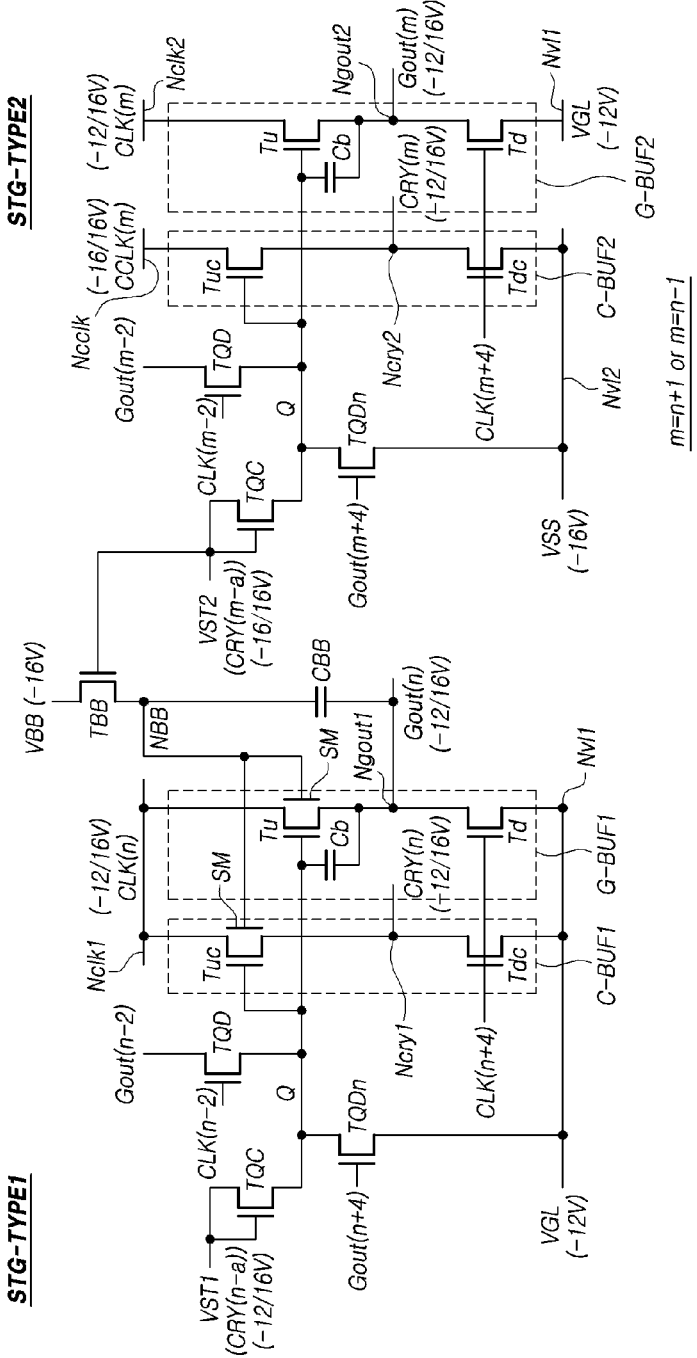
FIG. 12 is another exemplary diagram of a gate driving circuit having a differential structure according to aspects of the present disclosure.

With reference to FIGS. 11 and 12, it will be described in detail examples of the gate driving circuit 130 in which the odd-numbered stage circuit and the even-numbered stage circuit have a differential structure so that the odd-numbered stage circuit and the even-numbered stage circuit have different types (a first type, a second type).

FIG. 11 is an exemplary diagram of a gate driving circuit 130 having a differential structure according to aspects of the present disclosure.

Referring to FIG. 11, the gate driving circuit 130 having a differential structure according to aspects of the present disclosure may include a first type of stage circuit STG-TYPE1 among a first type and a second type, and a second type of stage circuit STG-TYPE2 among the first type and the second type.

The first type of stage circuit STG-TYPE1 may include a first carry output circuit C-BUF1 which receives a first clock signal CLK(n) and a first low-level voltage VGL and outputs a first carry signal CRY(n) to a first carry output node Ncry1, and first gate output circuit G-BUF1 which receives the first clock signal CLK(n) and the first low-level voltage VGL and outputs a first gate signal Gout(n) to a first gate output node Ngout1.

The second type of stage circuit STG-TYPE2 may include a second carry output circuit C-BUF2 receiving a carry clock signal CCLK(m) and a second low-level voltage VSS and outputting a second carry signal CRY(m) to a second carry output node Ncry2, and a second gate output circuit G-BUF2 receiving the second clock signal CLK(m) and the first low-level voltage VGL and outputting a second gate signal Gout(m) to a second gate output node Ngout2.

The bias transistor TBB may supply, when turned on, a bias voltage VBB to a shield metal SM positioned to overlap a semiconductor layer of a specific transistor TR among a plurality of transistors included in the first type of stage circuit STG-TYPE1. The shield metal SM corresponds to the bias node NBB.

Hereinafter, it will be described in more detail the structures of the first type of stage circuit STG-TYPE1 and the second type of stage circuit STG-TYPE2.

In the first type of stage circuit STG-TYPE1, the first carry output circuit C-BUF1 may include a first carry pull-up transistor Tuc to which the first clock signal CLK(n) is input, and a first carry pull-down transistor Tdc to which the first low-level voltage VGL is input, and may output a first carry signal CRY(n) to a first carry output node Ncry1 which is connected to the first carry pull-up transistor Tuc and the first carry pull-down transistor Tdc.

In the first type of stage circuit STG-TYPE1, the first gate output circuit G-BUF1 may include a first gate pull-up transistor Tu to which the first clock signal CLK(n) is input, and a first gate pull-down transistor Td to which the first low-level voltage VGL is input, and may output a first gate signal Gout(n) to a first gate output node Ngout1 to which the first gate pull-up transistor Tu and the first gate pull-down transistor Td are connected.

In the first carry output circuit C-BUF1 of the first type of stage circuit STG-TYPE1, the first carry pull-up transistor Tuc may control a connection between a common clock node Nclk1 to which the first clock signal CLK(n) is input and a first carry output node Ncry1. The first carry pull-down transistor Tdc may control a connection between the first low-level node Nvl1 to which the first low-level voltage VGL is applied and the first carry output node Ncry1.

In the first gate output circuit G-BUF1 of the first type of stage circuit STG-TYPE1, the first gate pull-up transistor Tu may control a connection between the common clock node Nclk1 and the first gate output node Ngout1, and the first gate pull-down transistor Td may control a connection between the first low-level node Nvl1 and the first gate output node Ngout1.

In the second type of stage circuit STG-TYPE2, the second carry output circuit C-BUF2 may include a second carry pull-up transistor Tuc to which a carry clock signal CCLK(m) is input, and a second carry pull-down transistor Tdc to which a second low-level voltage VSS is input, and may output a second carry signal CRY(m) to a second carry output node Ncry2 to which the second carry pull-up transistor Tuc and the second carry pull-down transistor Tdc are connected.

In the second type of stage circuit STG-TYPE2, the second gate output circuit G-BUF2 may include a second gate pull-up transistor Tu to which the second clock signal CLK(m) is input, and a second gate pull-down transistor Td to which the first low-level voltage VGL is input, and may output a second gate signal Gout(m) to a second gate output node Ngout2 to which the second gate pull-up transistor Tu and the second gate pull-down transistor Td are connected.

In the second carry output circuit C-BUF2 of the second type of stage circuit STG-TYPE2, the second carry pull-up transistor Tuc may control a connection between the carry clock node Ncclk to which the carry clock signal CCLK(m) is input and a second carry output node Ncry2, and the second carry pull-down transistor Tdc may control a connection between a second low-level node Nvl2 to which the second low-level voltage VSS is applied and the second carry output node Ncry2.

In the second gate output circuit G-BUF2 of the second type of stage circuit STG-TYPE2, the second gate pull-up transistor Tu may control a connection between the gate clock node Nclk2 to which the second clock signal CLK(m) is input and the second gate output node Ngout2. The second gate pull-down transistor Td may control a connection between the first low-level node Nvl1 to which the first low-level voltage VGL is applied and the second gate output node Ngout2.

Referring to FIG. 11, the bias transistor TBB may supply, when turned on, a bias voltage VBB to a shield metal SM positioned to overlap a semiconductor layer 540 of the first gate pull-up transistor Tu included in the first type of stage circuit STG-TYPE1.

Referring to FIG. 11, the bias transistor TBB may supply, when turned on, a bias voltage VBB to a shield metal SM positioned to overlap the semiconductor layer of the first carry pull-up transistor Tuc as a specific transistor TR included in the first type of stage circuit STG-TYPE1.

Referring to FIG. 11, the first type of stage circuit STG-TYPE1 may include a first Q node charging transistor TQC for charging a gate node of the first gate pull-up transistor Tu, a first Q node discharging transistor TQD for discharging the gate node of the first gate pull-up transistor Tu, a first QB node charging transistor TQBC for charging a gate node of the first gate pull-down transistor Td, and a first QB node discharging transistor TQBDq for discharging the gate node of the first gate pull-down transistor Td.

The first Q node charging transistor TQC is turned on by the high-level voltage (e.g., 16 V) of the first start signal VST1 to apply the high-level voltage (e.g., 16 V) of the first start signal VST1 to the Q node. Accordingly, the Q node may be charged, and the first carry pull-up transistor Tuc and the first gate pull-up transistor Tu may be turned on.

The first start signal VST1 is a signal having a predetermined amplitude (e.g., 28 V=16 V−(−12 V)), and may be a carry signal CRY(n-a) output from another stage circuit depending on the position of the first type of stage circuit STG-TYPE1.

The first Q node discharging transistor TQD may apply, when turned on, a first low-level voltage VGL, for example, −12 V, to the Q node. Accordingly, the Q node may be discharged, and the first carry pull-up transistor Tuc and the first gate pull-up transistor Tu may be turned off.

A driving voltage Vdd is applied to the QB node by the turned-on first QB node charging transistor TQBC, to that the first Q node discharging transistor TQD may be turned on. The driving voltage Vdd is applied to the QB node, and the first Q node discharging transistor TQD is turned on, so that the first low-level voltage VGL (e.g., −12 V) may be applied to the Q node. Accordingly, the Q node may be discharged, and the first carry pull-up transistor Tuc and the first gate pull-up transistor Tu may be turned off. Here, for example, the driving voltage Vdd may have 16 V.

The first QB node charging transistor TQBC may be turned on by the driving voltage Vdd to apply the driving voltage Vdd to the QB node. Accordingly, the QB node may be charged, and the first carry pull-down transistor Tdc and the first gate pull-down transistor Td may be turned on.

The first QB node discharging transistor TQBDq may be turned on by the voltage of the Q node to apply the first low-level voltage VGL (e.g., −12 V) to the QB node. Accordingly, the QB node may be discharged, and the first carry pull-down transistor Tdc and the first gate pull-down transistor Td may be turned off.

Referring to FIG. 11, the second type of stage circuit STG-TYPE2 may further include a second Q node charging transistor TQC for charging a gate node of the second gate pull-up transistor Tu, a second Q node discharging transistor TQD for discharging a gate node of the second gate pull-up transistor Tu, a second QB node charging transistor TQBC for charging a gate node of the second gate pull-down transistor Td, and a second QB node discharging transistor TQBDq for discharging a gate node of the second gate pull-down transistor Td.

The second Q node charging transistor TQC is turned on by the high-level voltage (e.g., 16 V) of the second start signal VST2 to apply the high-level voltage (e.g., 16 V) of the second start signal VST2 to a Q node. Accordingly, the Q node may be charged, and the second carry pull-up transistor Tuc and the second gate pull-up transistor Tu may be turned on.

The second start signal VST2 is a signal having a predetermined amplitude (e.g., 32 V=16 V−(−16 V)), and may be a carry signal CRY(m-a) output from another stage circuit depending on the position of the second type of stage circuit STG-TYPE2.

The second Q node discharging transistor TQD may apply a second low-level voltage (VSS, for example, −16 V) to the Q node when turned on. Accordingly, the Q node may be discharged, and the second carry pull-up transistor Tuc and the second gate pull-up transistor Tu may be turned off.

The driving voltage Vdd is applied to the QB node by the turned-on second QB node charging transistor TQBC, so that the second Q node discharging transistor TQD may be turned on. The driving voltage Vdd is applied to the QB node, and the second Q node discharging transistor TQD is turned on, so that the second low-level voltage VSS (e.g., −16 V) may be applied to the Q node. Accordingly, the Q node may be discharged, and the second carry pull-up transistor Tuc and the second gate pull-up transistor Tu may be turned off. Here, for example, the driving voltage Vdd may have 16 V.

The second QB node charging transistor TQBC may be turned on by the driving voltage Vdd to apply the driving voltage Vdd to the QB node. Accordingly, the QB node may be charged, and the second carry pull-down transistor Tdc and the second gate pull-down transistor Td may be turned on.

The second QB node discharging transistor TQBDq may be turned on by the voltage of the Q node to apply the second low-level voltage VSS (e.g., −16 V) to the QB node. Accordingly, the QB node may be discharged, and the second carry pull-down transistor Tdc and the second gate pull-down transistor Td may be turned off.

Referring to FIG. 11, the bias transistor TBB may supply, when turned on, the bias voltage VBB to the shield metal SM positioned to overlap the semiconductor layer 540 of the first QB node discharging transistor TQBDq as the specific transistor TR included in the first type of stage circuit STG-TYPE1.

Referring to FIG. 11, the gate node of the bias transistor TBB may be electrically connected to the gate node of the second Q node charging transistor TQC included in the second type of stage circuit STG-TYPE2.

FIG. 12 is another exemplary diagram of a gate driving circuit 130 having a differential structure according to aspects of the present disclosure.

Compared with the gate driving circuit 130 having a differential structure illustrated in FIG. 11, the gate driving circuit 130 having a differential structure according to the aspects of the present disclosure illustrated in FIG. 12 differs only in that it does not include the transistors TQBC and TQBDq for charging and discharging the QB node of the first type of stage circuit STG-TYPE1 and the transistors TQBC and TQBDq for charging and discharging the QB node of the second type of stage circuit STG-TYPE2, and it controls the QB node of the first type of stage circuit STG-TYPE1 and the QB node of the second type of stage circuit STG-TYPE2 by using another carry signals (clock signals) in the form of AC signals CLK(n+4) and CLK(m+4).

According to this difference, another clock signal CLK(n+4) may be input to the gate node of the first gate pull-down transistor Td of the first type of stage circuit STG-TYPE1, and another clock signal CLK(m+4) may be input to the gate node of the second gate pull-down transistor Td of the second type of stage circuit STG-TYPE2.

Here, the QB node of the first type of stage circuit STG-TYPE1 is the gate node of the first carry pull-down transistor Tdc and the first gate pull-down transistor Td. The QB node of the second type of stage circuit STG-TYPE2 is the gate node of the second carry pull-down transistor Tdc and the second gate pull-down transistor Td.

Referring to FIG. 12, the first type of stage circuit STG-TYPE1 may further include a first Q node charging transistor TQC for charging the gate node of the first gate pull-up transistor Tu, and a first Q node discharging transistors TQD and TQDn for discharging the gate node of the first gate pull-up transistor Tu.

The first Q node charging transistor TQC is turned on by the high-level voltage (e.g., 16 V) of the first start signal VST1 so as to apply the high-level voltage (e.g., 16 V) of the first start signal VST1 to the Q node. Accordingly, the Q node may be charged, and the first carry pull-up transistor Tuc and the first gate pull-up transistor Tu may be turned on.

The first start signal VST1 is a signal having a predetermined amplitude (e.g., 28 V=16 V−(−12 V)), and may be a carry signal CRY(n-a) output from another stage circuit depending on the position of the first type of stage circuit STG-TYPE1.

The first Q node discharging transistor TQD may be controlled to be turned on/off by another carry signal CLK(n−2), and when turned on, may apply another gate signal Gout(n−2) to the Q node. In this case, the voltage of the another gate signal Gout(n−2) may be a low-level voltage.

Another first Q node discharging transistor TQDn may be controlled to be turned on/off by another gate signal Gout(n+4), and when turned on, may apply the first low-level voltage VGL (e.g., −12 V) to the Q node.

The Q node is discharged by the first Q node discharging transistor TQD and another first Q node discharging transistor TQDn, so that the voltage of the Q node may be lowered to the first low-level voltage VGL (e.g., −12 V). Accordingly, the first carry pull-up transistor Tuc and the first gate pull-up transistor Tu may be turned off.

In this case, when the Q node is discharged, the another carry signal CLK(+4) applied to the gate node of the first carry pull-down transistor Tdc and the first gate pull-down transistor Td may have a high-level voltage. Accordingly, when the Q node is discharged, the first carry pull-down transistor Tdc and the first gate pull-down transistor Td are turned on.

Thereafter, another carry signal CLK(+4) applied to the gate node of the first carry pull-down transistor Tdc and the first gate pull-down transistor Td may be changed to the first low-level voltage VGL (e.g., −12 V). Accordingly, the first carry pull-down transistor Tdc and the first gate pull-down transistor Td may be turned off.

Referring to FIG. 12, the second type of stage circuit STG-TYPE2 may further include a second Q node charging transistor TQC for charging the gate node of the second gate pull-up transistor Tu, second Q node discharging transistors TQD and TQDn for discharging the gate node of the second gate pull-up transistor Tu.

The second Q node charging transistor TQC is turned on by the high-level voltage (e.g., 16 V) of the second start signal VST2, and may apply the high-level voltage (e.g., 16 V) of the second start signal VST2 to the Q node. Accordingly, the Q node may be charged, and the second carry pull-up transistor Tuc and the second gate pull-up transistor Tu may be turned on.

The second start signal VST2 is a signal having a predetermined amplitude (e.g., 28 V=16 V−(−12 V)), and may be a carry signal CRY(m-a) output from another stage circuit according to the position of the second type of stage circuit STG-TYPE2. Here, m may be (n+1) or (n−1).

The second Q node discharging transistor TQD may be controlled to be turned on/off by another carry signal CLK(m−2), and may apply, when turned on, another gate signal Gout(m−2) to the Q node. In this case, the voltage of another gate signal Gout(m−2) may be a low-level voltage.

Another second Q node discharging transistor TQDn may be controlled to be turned on/off by another gate signal Gout(m+4), and when turned on, may apply a second low-level voltage VSS (e.g., −16 V) to the Q node.

The Q node is discharged by the second Q node discharging transistor TQD and another second Q node discharging transistor TQDn, so that the voltage of the Q node may be lowered to the second low-level voltage VSS (e.g., −16 V). Accordingly, the second carry pull-up transistor Tuc and the second gate pull-up transistor Tu may be turned off.

In this case, when the Q node is discharged, the voltage of another carry signals CLK(m+4) applied to the gate nodes of the second carry pull-down transistor Tdc and the second gate pull-down transistor Td may have a high-level voltage. Accordingly, when the Q node is discharged, the second carry pull-down transistor Tdc and the second gate pull-down transistor Td are turned on.

Thereafter, another carry signal CLK(m+4) applied to the gate node of the second carry pull-down transistor Tdc and the second gate pull-down transistor Td may change to the second low-level voltage VSS (e.g., −16 V). Accordingly, the second carry pull-down transistor Tdc and the second gate pull-down transistor Td may be turned off.

Referring to FIGS. 11 and 12, the first Q node charging transistor TQC of the first type of stage circuit STG-TYPE1 may be controlled to be turned on or off by using the first start signal VST1.

Referring to FIGS. 11 and 12, the second Q node charging transistor TQC and the bias transistor TBB of the second type of stage circuit STG-TYPE2 may be controlled to be turned on/off according to the second start signal VST2.

Referring to FIGS. 11 and 12, the amplitude of the first start signal VST1 input to the first type of stage circuit STG-TYPE1 may be different from the amplitude of the second start signal VST2 input to the second type of stage circuit STG-TYPE2. For example, the amplitude of the first start signal VST1 may be 28 V, and the amplitude of the second start signal VST2 may be 32 V.

For example, the high-level voltage of the first start signal VST1 and the high-level voltage of the second start signal VST2 are equal to 16 V, however, the low-level voltage of the first start signal VST1 may be −12 V and the low-level voltage of the second start signal VST2 may be −16 V, which may be different from each other. Here, the low-level voltage of the first start signal VST1 may be the first low-level voltage VGL, and the low-level voltage of the second start signal VST2 may be the second low-level voltage VSS.

Referring to FIGS. 11 and 12, the on-off of the bias transistor may be controlled according to the second start signal VST2.

Figure 13:
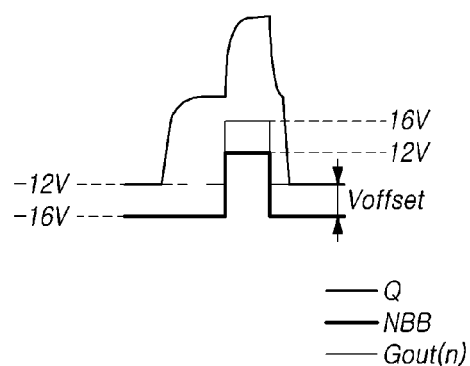
FIGS. 13 and 14 illustrate voltage states for main nodes in each of a first type of stage circuit and a second type of stage circuit included in a gate driving circuit having a differential structure according to aspects of the present disclosure.
Figure 14:
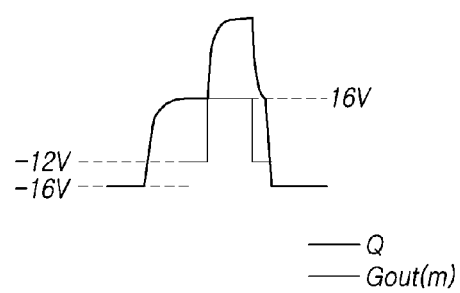

FIGS. 13 and 14 illustrate voltage states for main nodes (Q node, NBB, gate output node) in each of a first type of stage circuit STG-TYPE1 and a second type of stage circuit STG-TYPE2 included in a gate driving circuit 130 having a differential structure according to aspects of the present disclosure.

Referring to FIG. 13, in the first type of stage circuit STG-TYPE1, the low-level voltage of the gate node (Q node) of the first gate pull-up transistor Tu may be higher than the bias voltage VBB. That is, in the first type of stage circuit STG-TYPE1, the low-level voltage (e.g., −12 V) of the gate node (Q node) of the first gate pull-up transistor Tu may be higher than the low-level voltage (e.g., −16 V) of the bias node NBB.

Referring to FIG. 13, in the first type of stage circuit STG-TYPE1, the gate node (Q node) of the first gate pull-up transistor Tu may have a voltage that is increased by the offset voltage Voffset (e.g., 4 V) by the voltage of the bias node NBB. The offset voltage Voffset may correspond to a voltage difference between the second low-level voltage VSS (for example, −16 V) and the first low-level voltage VGL (for example, −12 V).

Here, the bias voltage VBB may be a voltage lower than the first low-level voltage VGL (for example, −12 V), and may be the same voltage as the second low-level voltage VSS (for example, −16 V).

Referring to FIG. 13, the voltage of the first gate signal Gout(n) output from the first type of stage circuit STG-TYPE1 is a voltage increased from the voltage of the bias node NBB by the offset voltage 4 V. This is due to the bias capacitor CBB connected between the bias node NBB and the first gate output node Ngout1.

Referring to FIG. 14, in the second type of stage circuit STG-TYPE2, the low-level voltage of the gate node (Q node) of the second gate pull-up transistor Tu may be same as the bias voltage VBB. That is, in the second type of stage circuit STG-TYPE2, the low-level voltage (e.g., −16 V) of the gate node (Q node) of the second gate pull-up transistor Tu may be equal to the low-level voltage (e.g., −16 V) of the bias node NBB.

Referring to FIG. 14, the low-level voltage VGL (e.g., −12 V) of the second gate signal Gout(m) (m=n−1 or m=n+1) output from the second type of stage circuit STG-TYPE2 may be higher than the low-level voltage (e.g., −16 V) of the gate node (Q node) of the second gate pull-up transistor Tu.

Figure 15:
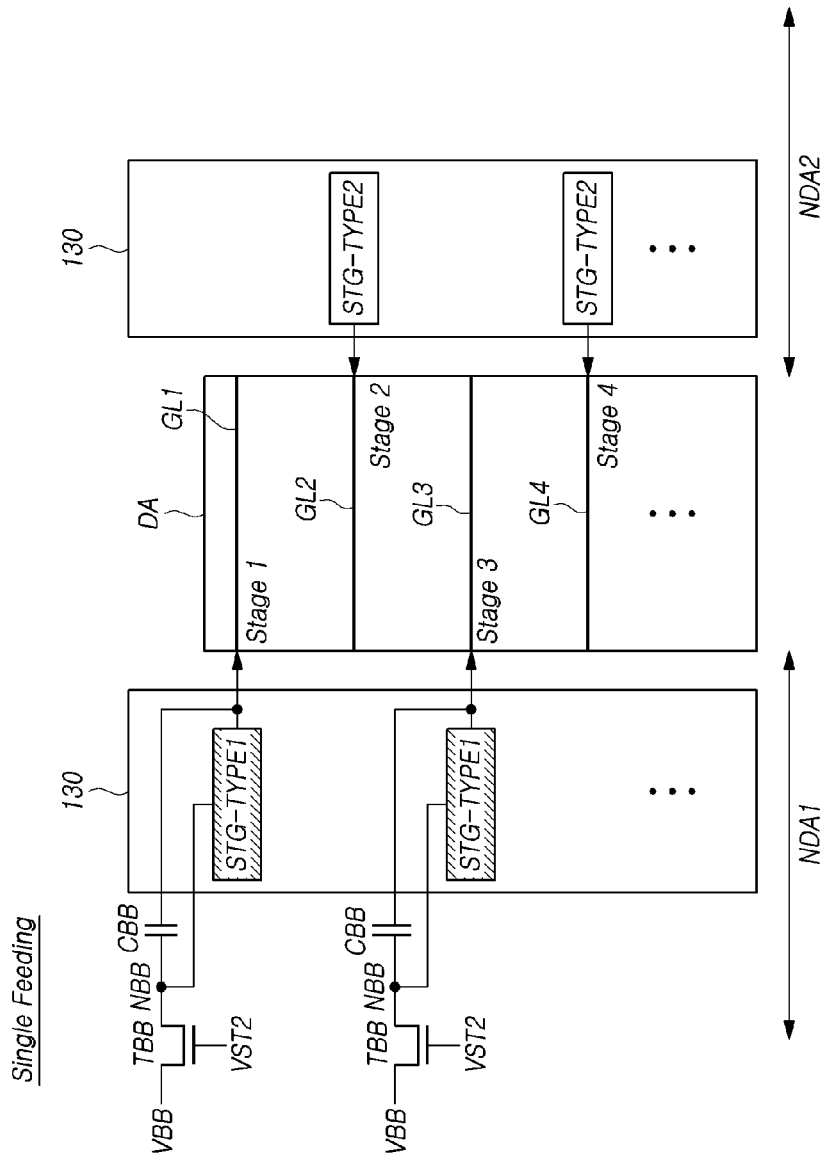
FIG. 15 illustrates a case in which a gate driving circuit having a differential structure is designed as a single feeding structure according to aspects of the present disclosure.

FIG. 15 illustrates a case in which a gate driving circuit 130 having a differential structure is designed as a single feeding structure according to aspects of the present disclosure.

Referring to FIG. 15, the plurality of gate lines GL disposed in the display area DA of the display panel 110 may include first to fourth gate lines GL1 to GL4.

Referring to FIG. 15, in the gate driving circuit 130, the first type of stage circuits STG-TYPE1 may output gate signals to the corresponding gate lines GL1 and GL3. The second type of stage circuits STG-TYPE2 may output gate signals to the corresponding gate lines GL2 and GL4.

Referring to FIG. 15, among the first gate line GL1 and the second gate line GL2, one may be an odd-numbered gate line, and another may be an even-numbered gate line. For example, the first gate line GL1 may be an odd-numbered gate line, and the second gate line GL2 may be an even-numbered gate line. Conversely, the first gate line GL1 may be an even-numbered gate line, and the second gate line GL2 may be an odd-numbered gate line. In FIG. 15, for convenience of description, it is assumed that the first gate line GL1 is an odd-numbered gate line and the second gate line GL2 is an even-numbered gate line.

Accordingly, the first type of stage circuits STG-TYPE1 of the odd-numbered stage (e.g., stage 1, stage 3) may output gate signals to the corresponding gate lines GL1 and GL3. The second type of stage circuits STG-TYPE2 of the even-numbered stage (e.g., the second stage and the fourth stage) may output gate signals to the corresponding gate lines GL2 and GL4.

In the case of the stage circuits STG-TYPE1 of the odd-numbered stage (e.g., stage 1, stage 3) of the first type, the bias voltage VBB may be supplied from the bias transistor TBB.

In the case that the gate signal supply structure is a single feeding structure, the first type of stage circuits STG-TYPE1 of the odd-numbered stage (e.g., stage 1, stage 3) and the second type of stage circuits STG-TYPE2 of the even-numbered stage (e.g., the second stage and the fourth stage) may output the gate signal to different gate lines.

That is, the first-staged stage circuit of the first type outputs a gate signal to the first gate line GL1, and the second-staged stage circuit of the second type outputs a gate signal to the second gate line GL2. The third-staged stage circuit of the first type outputs a gate signal to the third gate line GL3, and the fourth-staged stage circuit of the second type outputs a gate signal to the fourth gate line GL4.

Referring to FIG. 15, the non-display area NDA outside the display area DA may include a first non-display area NDA1 positioned on one side of the display area DA and a second non-display area NDA2 positioned on another side of the display area DA.

One of the first type of stage circuits STG-TYPE1 and the second type of stage circuit STG-TYPE2 is connected or disposed in the first non-display area NDA1, and another may be connected to or disposed in the second non-display area NDA2.

For example, the first type of stage circuits STG-TYPE1 may be connected or disposed in the first non-display area NDA1, and the second type of stage circuits STG-TYPE2 may be connected or disposed in the second non-display area NDA2. Conversely, the first type of stage circuits STG-TYPE1 may be connected to or disposed in the second non-display area NDA2, and the second type of stage circuits STG-TYPE2 may be connected or disposed in the first non-display area NDA1.

Alternatively, both the first type of stage circuits STG-TYPE1 and the second type of stage circuits STG-TYPE2 may be disposed in the first non-display area NDA1. Alternatively, both the first type of stage circuits STG-TYPE1 and the second type of stage circuits STG-TYPE2 may be disposed in the second non-display area NDA2.

Figure 16:
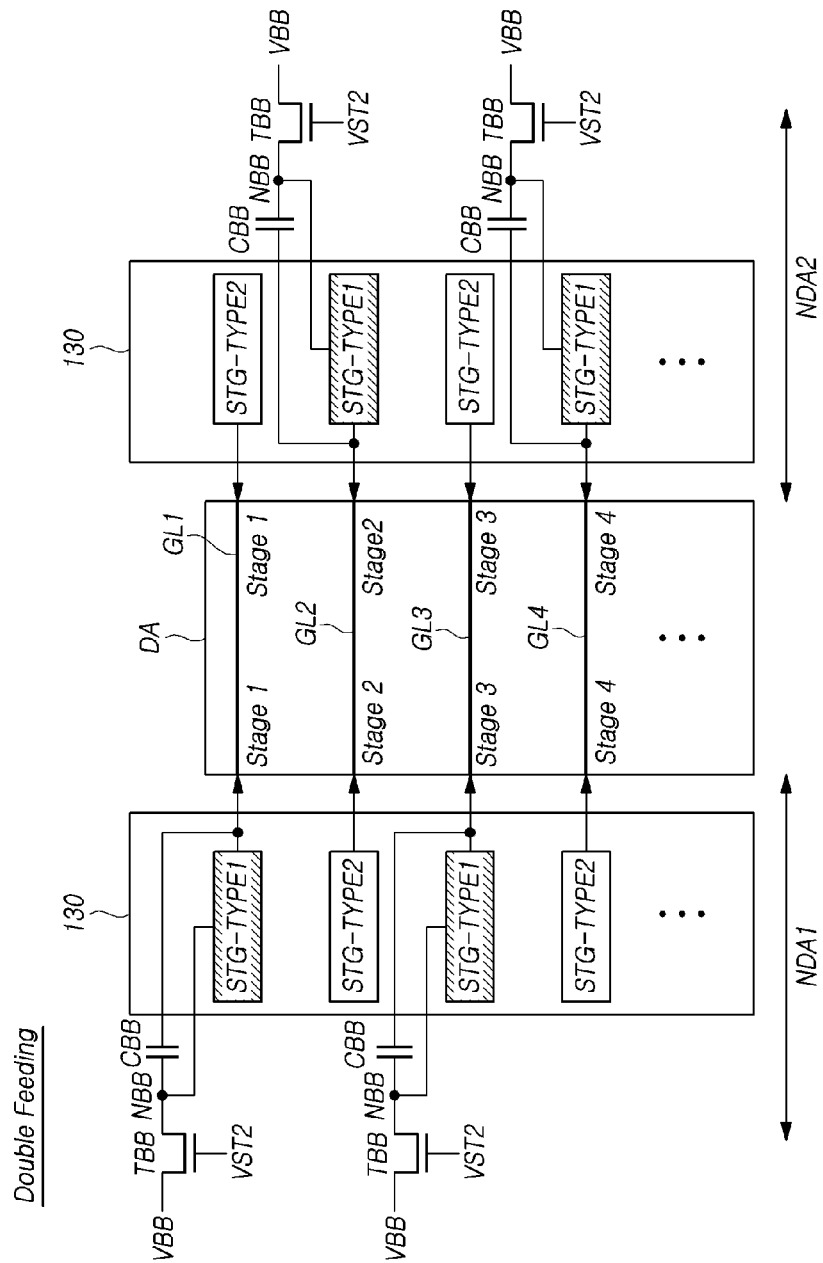
FIG. 16 illustrates a case in which a gate driving circuit having a differential structure is designed in a double feeding structure according to aspects of the present disclosure.

FIG. 16 illustrates a case in which a gate driving circuit 130 having a differential structure is designed in a double feeding structure according to aspects of the present disclosure.

Referring to FIG. 16, in the case that the gate signal supply structure is a double feeding structure, the first type of stage circuit STG-TYPE1 and the second type of stage circuit STG-TYPE2 may be connected or disposed in the first non-display area NDA1, and another stage circuit STG-TYPE1 of the first type and another stage circuit STG-TYPE2 of the second type may be connected or disposed in the second non-display area NDA2.

For example, according to the double feeding structure, the stage circuits of the first type STG-TYPE1 in the odd-numbered stage (e.g., first stage, third stage) and the stage circuits of the second type STG-TYPE2 in the even-numbered stage (e.g., second stage, fourth stage) may be connected to or disposed in the first non-display area NDA1.

The stage circuits of the first type STG-TYPE1 in the even-numbered stage (e.g., second stage, fourth stage) and the stage circuits of the second type STG-TYPE2 in the odd-numbered stage (e.g., first stage, third stage) may be connected to or disposed in the second non-display area NDA2.

The stage circuits of the first type STG-TYPE1 in the odd-numbered stage (e.g., first stage, third stage) may receive the bias voltage VBB from the bias transistor TBB. The stage circuits of the first type STG-TYPE1 in the even-numbered stage (e.g., second stage, fourth stage) may receive the bias voltage VBB from the bias transistor TBB.

According to the above-described double feeding structure, since the first type of stage circuit STG-TYPE1 is alternately connected or disposed in the first non-display area NDA1 and the second non-display area NDA2, there may be prevented an unexpected signal output deviation due to the differential structure.

According to the aspects of the present disclosure described above, it is possible to provide the gate driving circuit 130 and the display device 100 capable of preventing the occurrence of leakage current inside the gate driving circuit.

According to the aspects of the present disclosure, it is possible to provide the gate driving circuit 130 and the display device 100 designed to have a differential structure including stage circuits of different types (first type and second type).

According to the aspects of the present disclosure, it is possible to provide the gate driving circuit 130 and the display device 100 capable of preventing the leakage current by using a differential structure including the odd-numbered stage circuit (the first type or second type stage circuit) and the even-numbered stage circuit (the second type or the first type stage circuit).

According to the aspects of the present disclosure, it is possible to provide the gate driving circuit 130 and the display device 100 capable of preventing gate output deviation by alternately disposing stage circuits of different types (first type and second type) on both sides of the panel, while preventing leakage current through the differential structure with the odd-numbered stage circuit and the even-numbered stage circuit.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A gate driving circuit comprising:
a first type of stage circuit including a first carry output circuit receiving a first clock signal and a first low-level voltage and outputting a first carry signal to a first carry output node, and a first gate output circuit receiving the first clock signal and the first low-level voltage and outputting a first gate signal to a first gate output node;
a second type of stage circuit including a second carry output circuit receiving a carry clock signal and a second low-level voltage and outputting a second carry signal to a second carry output node, and a second gate output circuit receiving a second clock signal and the first low-level voltage and outputting a second gate signal to a second gate output node; and
a bias transistor for supplying, when turned on, a bias voltage to a shield metal positioned to overlap with a semiconductor layer of a specific transistor among a plurality of transistors included in the first type of stage circuit,
wherein a first start signal input to the first type of stage circuit and a second start signal input to the second type of stage circuit have different amplitudes from each other.

2. The gate driving circuit of claim 1, wherein the first carry output circuit comprises a first carry pull-up transistor to which the first clock signal is input and a first carry pull-down transistor to which the first low-level voltage is input, and outputs the first carry signal to the first carry output node to which the first carry pull-up transistor and the first carry pull-down transistor are connected,
wherein the first gate output circuit comprises a first gate pull-up transistor to which the first clock signal is input and a first gate pull-down transistor to which the first low-level voltage is input, and outputs the first gate signal to the first gate output node to which the first gate pull-up transistor and the first gate pull-down transistor are connected,
wherein the second carry output circuit comprises a second carry pull-up transistor to which the carry clock signal is input and a second carry pull-down transistor to which the second low-level voltage is input, and outputs the second carry signal to the second carry output node to which the second carry pull-up transistor and the second carry pull-down transistor are connected, and
wherein the second gate output circuit comprises a second gate pull-up transistor to which the second clock signal is input and a second gate pull-down transistor to which the first low-level voltage is input, and outputs the second gate signal to the second gate output node to which the second gate pull-up transistor and the second gate pull-down transistor are connected.

3. The gate driving circuit of claim 2, wherein the bias transistor supplies, when turned on, the bias voltage to a shield metal positioned to overlap with a semiconductor layer of the first gate pull-up transistor as the specific transistor included in the first type of stage circuit.

4. The gate driving circuit of claim 2, wherein the bias transistor supplies, when turned on, the bias voltage to a shield metal positioned to overlap with a semiconductor layer of the first carry pull-up transistor as the specific transistor included in the first type of stage circuit.

5. The gate driving circuit of claim 2, wherein the first type of stage circuit further comprises a first Q node charging transistor for charging a gate node of the first gate pull-up transistor, a first Q node discharging transistor for discharging a gate node of the first gate pull-up transistor, a first QB node charging transistor for charging a gate node of the first gate pull-down transistor, and a first QB node discharging transistor for discharging a gate node of the first gate pull-down transistor, and wherein the second type of stage circuit further comprises a second Q node charging transistor for charging a gate node of the second gate pull-up transistor, a second Q node discharging transistor for discharging a gate node of the second gate pull-up transistor, a second QB node charging transistor for charging a gate node of the second gate pull-down transistor, and a second QB node discharging transistor for discharging a gate node of the second gate pull-down transistor.

6. The gate driving circuit of claim 5, wherein the bias transistor supplies, when turned on, the bias voltage to a shield metal positioned to overlap with a semiconductor layer of the first QB node discharging transistor as the specific transistor included in the first type of stage circuit.

7. The gate driving circuit of claim 5, wherein a gate node of the bias transistor is electrically connected to a gate node of the second Q node charging transistor in the second type of stage circuit.

8. The gate driving circuit of claim 2, wherein the first type of stage circuit further comprises a first Q node charging transistor for charging a gate node of the first gate pull-up transistor and a first Q node discharging transistor for discharging a gate node of the first gate pull-up transistor, wherein the second type of stage circuit further comprises a second Q node charging transistor for charging a gate node of the second gate pull-up transistor and a second Q node discharging transistor for discharging a gate node of the second gate pull-up transistor, and wherein a third clock signal is input to a gate node of the first gate pull-down transistor, and a fourth clock signal is input to a gate node of the second gate pull-down transistor.

9. The gate driving circuit of claim 2, wherein a low-level voltage applied to a gate node of the first gate pull-up transistor is higher than the bias voltage, and a low-level voltage applied to a gate node of the second gate pull-up transistor is equal to the bias voltage.

10. The gate driving circuit of claim 1, wherein the bias transistor is controlled to be turned on/off based on another carry signal or a start signal input to the second type of stage circuit.

11. The gate driving circuit of claim 1, further comprising a bias capacitor connected between the shield metal and the first gate output node.

12. The gate driving circuit of claim 1, wherein the specific transistor is a coplanar type.

13. The gate driving circuit of claim 1, wherein, when the bias voltage is applied to the shield metal, a voltage difference between a source node and a gate node of the specific transistor is less than zero.

14. The gate driving circuit of claim 1, wherein, after the bias voltage is applied to the shield metal, a voltage of the shield metal increases in synchronization with a voltage change of the first gate output node, and the voltage of the shield metal increased in synchronization with the voltage change of the first gate output node is lower than a high-level voltage of the first gate output node.

15. A gate driving circuit comprising:
a first type of stage circuit including a first carry output circuit receiving a first clock signal and a first low-level voltage and outputting a first carry signal to a first carry output node, and a first gate output circuit receiving the first clock signal and the first low-level voltage and outputting a first gate signal to a first gate output node;

a second type of stage circuit including a second carry output circuit receiving a carry clock signal and a second low-level voltage and outputting a second carry signal to a second carry output node, and a second gate output circuit receiving a second clock signal and the first low-level voltage and outputting a second gate signal to a second gate output node; and a bias transistor for supplying, when turned on, a bias voltage to a shield metal positioned to overlap with a semiconductor layer of a specific transistor among a plurality of transistors included in the first type of stage circuit, wherein the bias voltage is lower than the first low-level voltage and equal to the second low-level voltage.

16. A display device comprising:
a substrate;
a first gate line and a second gate line disposed on the substrate; and
a gate driving circuit for outputting a first gate signal to the first gate line and outputting a second gate signal to the second gate line, wherein the gate driving circuit comprises:
a first type of stage circuit including a first carry output circuit receiving a first clock signal and a first low-level voltage and outputting a first carry signal to a first carry output node, and a first gate output circuit receiving the first clock signal and the first low-level voltage and outputting the first gate signal to the first gate line through a first gate output node;

a second type of stage circuit including a second carry output circuit receiving a carry clock signal and a second low-level voltage and outputting a second carry signal to a second carry output node, and a second gate output circuit receiving a second clock signal and the first low-level voltage and outputting the second gate signal to the second gate line through a second gate output node; and a bias transistor for supplying, when turned on, a bias voltage to a shield metal positioned to overlap a semiconductor layer of a specific transistor among a plurality of transistors included in the first type of stage circuit, wherein a first start signal input to the first type of stage circuit and a second start signal input to the second type of stage circuit have different amplitudes from each other.

17. The display device of claim 16, wherein, among the first gate line and the second gate line, one is an odd-numbered gate line and another is an even-numbered gate line.

18. The display device of claim 16, wherein the substrate comprises a display area and a non-display area outside the display area, wherein the non-display area comprises a first non-display area positioned on one side of the display area and a second non-display area positioned on another side of the display area, and wherein, among the first type of stage circuit and the second type of stage circuit, one is connected to or disposed in the first non-display area, and another is connected or disposed in the second non-display area.

19. The display device of claim 16, wherein the substrate comprises a display area and a non-display area outside the display area, wherein the non-display area comprises a first non-display area positioned on one side of the display area and a second non-display area positioned on another side of the display area, wherein the first type of stage circuit and the second type of stage circuit are connected to or disposed in the first non-display area, and another stage circuit of the first type and another stage circuit of the second type are connected or disposed in the second non-display area.

* * * * *